US012354558B2

(12) United States Patent
Yu et al.

(10) Patent No.: US 12,354,558 B2
(45) Date of Patent: Jul. 8, 2025

(54) DRIVING CIRCUIT, DRIVING METHOD, DRIVING MODULE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Ziyang Yu, Beijing (CN); Haijun Qiu, Beijing (CN); Ming Hu, Beijing (CN); Zhiliang Jiang, Beijing (CN); Tianyi Cheng, Beijing (CN); Jianpeng Wu, Beijing (CN); Wenbo Chen, Beijing (CN); Mengqi Wang, Beijing (CN); Cong Liu, Beijing (CN); Qian Xu, Beijing (CN); Qingqing Yan, Beijing (CN); Pan Zhao, Beijing (CN); Qing He, Beijing (CN); Xiangnan Pan, Beijing (CN); Quanyong Gu, Beijing (CN)

(73) Assignees: CHENGDU BOE OPTOELECTRONICS CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/558,383

(22) PCT Filed: Dec. 19, 2022

(86) PCT No.: PCT/CN2022/140042
§ 371 (c)(1),
(2) Date: Nov. 1, 2023

(87) PCT Pub. No.: WO2024/130490
PCT Pub. Date: Jun. 27, 2024

(65) Prior Publication Data
US 2025/0087166 A1   Mar. 13, 2025

(51) Int. Cl.
*G09G 3/3266* (2016.01)
*G09G 3/3258* (2016.01)

(52) U.S. Cl.
CPC ......... *G09G 3/3266* (2013.01); *G09G 3/3258* (2013.01); *G09G 2300/0819* (2013.01);
(Continued)

(58) Field of Classification Search
CPC ......... G09G 3/3677; G09G 3/36; G09G 3/20; G09G 3/32; G09G 3/18; G09G 3/3266;
(Continued)

(56) References Cited

U.S. PATENT DOCUMENTS

| 2001/0022572 A1* | 9/2001 | Murade ............... G09G 3/3648 345/98 |
| 2004/0021650 A1* | 2/2004 | Yamashita .......... G09G 3/3677 345/204 |

(Continued)

FOREIGN PATENT DOCUMENTS

| CN | 102779478 A | 11/2012 |
| CN | 104392686 A | 3/2015 |

(Continued)

OTHER PUBLICATIONS

International Search Report dated Sep. 18, 2024, issued in Application No. PCT/CN2024/101236, with English translation. (24 pages).

(Continued)

*Primary Examiner* — Dong Hui Liang
(74) *Attorney, Agent, or Firm* — WHDA, LLP

(57) ABSTRACT

A driving circuit includes a driving signal generation circuit, a gating circuit, an output control circuit and an output circuit; the driving signal generation circuit generates and outputs the Nth stage of driving signal; the gating circuit controls to write the gating input signal into the first node;
(Continued)

the output control circuit performs a NAND operation on the Nth stage of driving signal and the potential of the second terminal of the output control circuit to obtain a first output signal; the output circuit inverts the first output signal to obtain and provide an output driving signal through the output driving terminal; N is a positive integer.

20 Claims, 21 Drawing Sheets

(52) U.S. Cl.
CPC ............... *G09G 2300/0842* (2013.01); *G09G 2300/0861* (2013.01); *G09G 2310/0286* (2013.01); *G09G 2310/08* (2013.01); *G09G 2330/021* (2013.01)

(58) Field of Classification Search
CPC .. G09G 3/3648; G09G 3/3225; G09G 3/3688; G09G 3/006; G09G 3/3622; G09G 3/3625; G09G 3/3692; G09G 3/3681; G09G 3/3208; G09G 3/3233; G09G 2310/0286; G09G 2310/08; G09G 2310/04; G09G 2310/0262; G09G 2310/027; G09G 2310/0205; G09G 2330/021; G09G 2360/18; G09G 2320/109; G09G 5/395; G09G 2300/0842; G09G 2300/0857; G09G 2300/0814; G09G 2300/0426
See application file for complete search history.

(56) References Cited

U.S. PATENT DOCUMENTS

| | | | |
|---|---|---|---|
| 2011/0205196 A1* | 8/2011 | Okuno | G09G 3/3674 345/204 |
| 2014/0093028 A1 | 4/2014 | Wu | |
| 2014/0253418 A1 | 9/2014 | Pyun et al. | |
| 2015/0034950 A1 | 2/2015 | Miyazawa et al. | |
| 2016/0148556 A1 | 5/2016 | Tseng et al. | |
| 2016/0351112 A1* | 12/2016 | Qing | G09G 3/20 |
| 2018/0090090 A1 | 3/2018 | Feng et al. | |
| 2019/0057638 A1 | 2/2019 | Kim et al. | |
| 2019/0058029 A1 | 2/2019 | Woo et al. | |
| 2019/0180834 A1 | 6/2019 | Yuan et al. | |
| 2019/0304375 A1 | 10/2019 | Kim et al. | |
| 2019/0392916 A1 | 12/2019 | Gu et al. | |
| 2020/0184898 A1 | 6/2020 | Choi et al. | |
| 2020/0251044 A1 | 8/2020 | Lin et al. | |
| 2020/0342811 A1 | 10/2020 | Xuan et al. | |
| 2021/0193040 A1 | 6/2021 | Na | |
| 2022/0284861 A1 | 9/2022 | Yang et al. | |
| 2022/0343841 A1 | 10/2022 | Shang et al. | |
| 2023/0057970 A1 | 2/2023 | Yamamoto | |
| 2023/0207031 A1 | 6/2023 | Wang et al. | |
| 2023/0252933 A1 | 8/2023 | Guo et al. | |
| 2023/0282170 A1 | 9/2023 | Shang et al. | |

FOREIGN PATENT DOCUMENTS

| | | |
|---|---|---|
| CN | 106157923 A | 11/2016 |
| CN | 106971692 A | 7/2017 |
| CN | 106991973 A | 7/2017 |
| CN | 107393473 A | 11/2017 |
| CN | 107784977 A | 3/2018 |
| CN | 108597437 A | 9/2018 |
| CN | 108694894 A | 10/2018 |
| CN | 109427293 A | 3/2019 |
| CN | 109830256 A | 5/2019 |
| CN | 110322834 A | 10/2019 |
| CN | 111508433 A | 8/2020 |
| CN | 111933083 A | 11/2020 |
| CN | 111933084 A | 11/2020 |
| CN | 112687230 A | 4/2021 |
| CN | 112927644 A | 6/2021 |
| CN | 112992246 A | 6/2021 |
| CN | 113178161 A | 7/2021 |
| CN | 113178221 A | 7/2021 |
| CN | 113192551 A | 7/2021 |
| CN | 113421528 A | 9/2021 |
| CN | 113689824 A | 11/2021 |
| CN | 113689825 A | 11/2021 |
| CN | 113793570 A | 12/2021 |
| CN | 113870786 A | 12/2021 |
| CN | 114222615 A | 3/2022 |
| CN | 114495784 A | 5/2022 |
| CN | 114974067 A | 8/2022 |
| CN | 111798788 B | 9/2022 |
| CN | 217606538 U | 10/2022 |
| CN | 115376441 A | 11/2022 |
| CN | 115482780 A | 12/2022 |
| CN | 116778868 A | 9/2023 |
| CN | 117059033 A | 11/2023 |
| JP | 2013-213912 A | 10/2013 |
| JP | 2022-000833 A | 1/2022 |
| KR | 20170079775 A | 7/2017 |
| KR | 20180014365 A | 2/2018 |
| WO | 2021/161505 A1 | 8/2021 |
| WO | 2022/252092 A1 | 12/2022 |
| WO | 2023/213175 A1 | 11/2023 |

OTHER PUBLICATIONS

Ex Parte Quayle Action dated Jan. 8, 2025, issued in U.S. Appl. No. 18/288,412 (16 pages).

* cited by examiner

DRIVING CIRCUIT, DRIVING METHOD, DRIVING MODULE AND DISPLAY DEVICE

CROSS-REFERENCE TO RELATED APPLICATION

The present application is the U.S. national phase of PCT Application No. PCT/CN2022/140042 filed on Dec. 19, 2022, which is incorporated herein by reference in its entirety.

TECHNICAL FIELD

The present disclosure relates to the field of display technology, in particular to a driving circuit, a driving method, a driving module and a display device.

BACKGROUND

In the related art, when an Organic Light Emitting Diode (OLED) display screen is updated, it is necessary to initialize and write pixel voltages to all rows of pixel circuits within one frame. And in some special images, such as the Always On Display (AOD) images (the AOD image is an image that controls the partial lighting of the screen without lighting up the entire mobile phone screen), static images or less updated images, most of the pixel circuits in the whole screen do not need to update the pixel voltage, that is, most of the pixel circuits can maintain the original display brightness through low-leakage low temperature polycrystalline oxide (LTPO) thin film transistor (TFT), and repeated flashing of these pixel circuits causes waste of power consumption.

SUMMARY

In one aspect, the present disclosure provides in some embodiments a driving circuit, including a driving signal generation circuit, a gating circuit, an output control circuit and an output circuit; wherein the driving signal generation circuit is configured to generate and output an Nth stage of driving signal through an Nth stage of driving signal output terminal; the gating circuit is electrically connected to a first node, a gating input terminal and a gating control terminal respectively, and is configured to control to write a gating input signal provided by the gating input terminal into the first node under the control of a gating control signal provided by the gating control terminal; a first terminal of the output control circuit is electrically connected to the Nth stage of driving signal output terminal, and a second terminal of the output control circuit is electrically connected to the first node N1, the output control circuit is configured to perform a NAND operation on the Nth stage of driving signal and a potential of the second terminal of the output control circuit to obtain a first output signal; the output circuit is configured to invert the first output signal to obtain and provide an output driving signal through an output driving terminal; N is a positive integer.

Optionally, the gating circuit is configured to control to write the gating input signal provided by the gating input terminal into the first node when a potential of the (N−1)th stage of driving signal is a first voltage and a potential of the Nth stage of driving signal is a second voltage.

Optionally, the gating circuit includes a first transistor; a gate electrode of the first transistor is electrically connected to the gating control terminal, and a first electrode of the first transistor is electrically connected to the first node, a second electrode of the first transistor is electrically connected to the gating input terminal.

Optionally, the gating control terminal includes a first gating control terminal and a second gating control terminal; the gating circuit includes a first transistor and a second transistor; a gate electrode of the first transistor is electrically connected to the first gating control terminal, a first electrode of the first transistor is electrically connected to the first node, and a second electrode of the first transistor is electrically connected to a first electrode of the second transistor; a gate electrode of the second transistor is electrically connected to the second gating control terminal, and a second electrode of the second transistor is electrically connected to the gating input terminal; the first gating control terminal is an (N−1)th stage of driving signal output terminal, the second gating control terminal is the Nth stage of driving signal output terminal, the first transistor is an n-type transistor, and the second transistor is a p-type transistor; or, the first gating control terminal is the Nth stage of driving signal output terminal, the second gating control terminal is the (N−1)th stage of driving signal output terminal, the first transistor is a p-type transistor, and the second transistor is an n-type transistor; or, the first gating control terminal is an (N−1)th stage of second node, the second gating control terminal is the Nth stage of driving signal output terminal, and the first transistor and the second transistor are p-type transistors; or, the first gating control terminal is the Nth stage of driving signal output terminal, the second gating control terminal is the (N−1)th stage of second node, and both the first transistor and the second transistor are p-type transistors; or, the first gating control terminal is connected to an inversion signal of the (N−1)th stage of driving signal, the second gating control terminal is the Nth stage of driving signal output terminal, the first transistor and the second transistor are both p-type transistors; or, the first gating control terminal is the Nth stage of driving signal output terminal, and the second gating control terminal is connected to the inversion signal of the (N−1)th stage of driving signal; the first transistor and the second transistor are both p-type transistors; or, the first gating control terminal is the (N−1)th stage of driving signal terminal, the second gating control terminal is connected to an inversion signal of the Nth stage of driving signal, and the first transistor and the second transistor are both n-type transistors; or, the first gating control terminal is connected to the inversion signal of the Nth stage of driving signal, the second gating control terminal is the (N−1)th stage of driving signal terminal, and the first transistor and the second transistor are both n-type transistors.

Optionally, the driving circuit further includes an initialization circuit and a first voltage maintenance circuit; wherein the initialization circuit is electrically connected to an initial control terminal, a first voltage terminal and the first node, and is configured to control to connect the first node and the first voltage terminal under the control of an initial control signal provided by the initial control terminal; a first terminal of the first voltage maintenance circuit is electrically connected to the first node, a second terminal of the first voltage maintenance circuit is electrically connected to a DC voltage terminal or a third node, and the first voltage maintenance circuit is configured to maintain a potential of the first node.

Optionally, the driving circuit further includes a second voltage maintenance circuit, wherein the second voltage maintenance circuit includes a first inverter, a second inverter and a maintenance control circuit; an input terminal of the first inverter is electrically connected to the first node, an output terminal of the first inverter is electrically connected to the third node, and an input terminal of the second inverter is electrically connected to the third node, and an output terminal of the second inverter is electrically connected to a fourth node; the first inverter is configured to invert the potential of the first node, and output an inverted potential of the first node through the output terminal of the first inverter; the second inverter is configured to invert a potential of the input terminal of the second inverter, and output an inverted potential through the output terminal of the second inverter; the maintenance control circuit is electrically connected to the maintenance control terminal, the fourth node and the first node, and is configured to control to connect or disconnect the fourth node and the first node under the control of a maintenance control signal provided by the maintenance control terminal.

Optionally, the driving circuit further includes a second voltage maintenance circuit; wherein the first node is electrically connected to the second terminal of the output control circuit through the second voltage maintenance circuit; the second voltage maintenance circuit includes a first inverter, a second inverter and a maintenance control circuit; an input terminal of the first inverter is electrically connected to the first node, an output terminal of the first inverter is electrically connected to the third node, and an input terminal of the second inverter is electrically connected to the third node, and an output terminal of the second inverter is electrically connected to the fourth node and the second terminal of the output control circuit; the first inverter is configured to invert the potential of the first node, and output an inverted potential of the first node through the output terminal of the first inverter, and the second inverter is configured to invert a potential of the input terminal of the second inverter, and output an inverted potential through the output terminal of the second inverter; the maintenance control circuit is electrically connected to the maintenance control terminal, the fourth node and the first node, and is configured to control to connect or disconnect the fourth node and the first node under the control of the maintenance control signal provided by the maintenance control terminal.

Optionally, the maintenance control terminal includes a first maintenance control terminal and a second maintenance control terminal; the maintenance control circuit includes a third transistor and a fourth transistor; a gate electrode of the third transistor is electrically connected to the first maintenance control terminal, a first electrode of the third transistor is electrically connected to the first node, and a second electrode of the third transistor is electrically connected to the fourth node; a gate electrode of the fourth transistor is electrically connected to the second maintenance control terminal, a first electrode of the fourth transistor is electrically connected to the fourth node, and a second electrode of the fourth transistor is electrically connected to the first node; the third transistor is a p-type transistor, and the fourth transistor is an n-type transistor; the first maintenance control terminal is the (N−1)th stage of driving signal terminal, and the second maintenance control terminal is a first clock signal terminal; or, the first maintenance control terminal is a second clock signal terminal, and the second maintenance control terminal is the first clock signal terminal.

Optionally, the first inverter includes a fifth transistor and a sixth transistor, and the second inverter includes a seventh transistor and an eighth transistor; a gate electrode of the fifth transistor is electrically connected to the first node, a first electrode of the fifth transistor is electrically connected to the first voltage terminal, and a second electrode of the fifth transistor is electrically connected to the third node; a gate electrode of the sixth transistor is electrically connected to the first node, a first electrode of the sixth transistor is electrically connected to the third node, and a second electrode of the sixth transistor is electrically connected to the second voltage terminal; the fifth transistor is a p-type transistor, and the sixth transistor is an n-type transistor; a gate electrode of the seventh transistor is electrically connected to the third node, a first electrode of the seventh transistor is electrically connected to the first voltage terminal, and a second electrode of the seventh transistor is electrically connected to the fourth node; a gate electrode of the eighth transistor is electrically connected to the third node, a first electrode of the eighth transistor is electrically connected to the fourth node, and a second electrode of the eighth transistor is electrically connected to the second voltage terminal; the seventh transistor is a p-type transistor, and the eighth transistor is an n-type transistor.

Optionally, the initialization circuit includes a ninth transistor, and the first voltage maintenance circuit includes a first capacitor; a gate electrode of the ninth transistor is electrically connected to the initial control terminal, a first electrode of the ninth transistor is electrically connected to the first voltage terminal, and a second electrode of the ninth transistor is electrically connected to the first node; a first terminal of the first capacitor is electrically connected to the first node, and a second terminal of the first capacitor is electrically connected to the DC voltage terminal or the third node.

Optionally, the output control circuit includes a tenth transistor, an eleventh transistor, a twelfth transistor and a thirteenth transistor; a gate electrode of the tenth transistor is electrically connected to the Nth stage of driving signal output terminal, a first electrode of the tenth transistor is electrically connected to the first voltage terminal, and a second electrode of the tenth transistor is electrically connected to the fifth node; a gate electrode of the eleventh transistor is electrically connected to the first node, a first electrode of the eleventh transistor is electrically connected to the first voltage terminal, and a second electrode of the eleventh transistor is electrically connected to the fifth node; a gate electrode of the twelfth transistor is electrically connected to the Nth stage of driving signal output terminal, a first electrode of the twelfth transistor is electrically connected to a fifth node, and a second electrode of the twelfth transistor is electrically connected to a sixth node; a gate electrode of the thirteenth transistor is electrically connected to the first node, a first electrode of the thirteenth transistor is electrically connected to the sixth node, and a second electrode of the thirteenth transistor is electrically connected to the second voltage terminal; the tenth transistor and the eleventh transistor are p-type transistors, and the twelfth transistor and the thirteenth transistor are n-type transistors.

Optionally, the output control circuit includes a tenth transistor, an eleventh transistor, a twelfth transistor and a thirteenth transistor; a gate electrode of the tenth transistor is electrically connected to the Nth stage of driving signal output terminal, a first electrode of the tenth transistor is electrically connected to the first voltage terminal, and a second electrode of the tenth transistor is electrically connected to a fifth node; a gate electrode of the eleventh transistor is electrically connected to the fourth node, a first electrode of the eleventh transistor is electrically connected to the first voltage terminal, and a second electrode of the eleventh transistor is electrically connected to the fifth node; a gate electrode of the twelfth transistor is electrically connected to the Nth stage of driving signal output terminal, a first electrode of the twelfth transistor is electrically connected to the fifth node, and a second electrode of the twelfth transistor is electrically connected to a sixth node; a gate electrode of the thirteenth transistor is electrically connected to the fourth node, a first electrode of the thirteenth transistor is electrically connected to the sixth node, and a second electrode of the thirteenth transistor is electrically connected to the second voltage terminal; the tenth transistor and the eleventh transistor are p-type transistors, and the twelfth transistor and the thirteenth transistor are n-type transistors.

Optionally, the output circuit includes a fourteenth transistor and a fifteenth transistor; a gate electrode of the fourteenth transistor is electrically connected to the fifth node, a first electrode of the fourteenth transistor is electrically connected to the first voltage terminal, and a second electrode of the fourteenth transistor is connected to the output driving terminal; a gate electrode of the fifteenth transistor is electrically connected to the fifth node, a first electrode of the fifteenth transistor is electrically connected to the output driving terminal, and a second electrode of the fifteenth transistor is electrically connected to the second voltage terminal.

Optionally, the driving signal generation circuit includes a first control node control circuit, a second control node control circuit, a first driving output circuit, and a second driving output circuit; the first control node control circuit is configured to control a potential of a first control node; the second control node control circuit is configured to control a potential of a second control node; the first driving output circuit is electrically connected to the first control node, the first voltage terminal and the Nth stage of driving signal output terminal respectively, and is configured to control to connect the Nth stage of driving signal output terminal and the first voltage terminal under the control of the potential of the first control node; the second driving output circuit is electrically connected to the second control node, the second voltage terminal, and the Nth stage of driving signal output terminal, and is configured to control to connect the Nth stage of driving signal output terminal and the second voltage terminal under the control of the potential of the second control node.

Optionally, the first control node control circuit includes a seventh node control circuit, an eighth node control circuit, and a first control circuit; the seventh node control circuit is respectively electrically connected to a first clock signal terminal, a first voltage terminal, a seventh node and a ninth node, and is configured to control to connect the seventh node and the first voltage terminal under the control of a first clock signal provided by the first clock signal terminal, control to connect the seventh node and the first clock signal terminal under the control of a potential of the ninth node; the eighth node control circuit is electrically connected to a second voltage terminal, the seventh node, and an eighth node, and is configured to control to connect the seventh node and the eighth node under the control of a second voltage signal provided by the second voltage terminal; the first control circuit is electrically connected to the eighth node, the second node, the second clock signal terminal, the ninth node, the first voltage terminal and the first control node, and is configured to control to connect the second node and the second clock signal terminal under the control of a potential of the eighth node, control the potential of the second node according to the potential of the eighth node, and control to connect the second node and the first control node under the control of the second clock signal provided by the second clock signal terminal, and control to connect the first control node and the first voltage terminal under the control of a potential of the ninth node.

Optionally, the second control node control circuit includes a ninth node control circuit, a tenth node control circuit, an eleventh node control circuit, and a second control circuit; the ninth node control circuit is electrically connected to the first clock signal terminal, the (N−1)th stage of driving signal output terminal, the initial control terminal, the first voltage terminal and the ninth node, is configured to control to connect the (N−1)th stage of driving signal output terminal and the ninth node under the control of the first clock signal provided by the first clock signal terminal, and control to connect the ninth node and the first voltage terminal under the control of the initial control signal provided by the initial control terminal; the tenth node control circuit is electrically connected to the first clock signal terminal, the (N−1)th stage of driving signal output terminal and a tenth node, and is configured to control to connect the (N−1)th stage of driving signal output terminal and the tenth node under the control of the first clock signal; the eleventh node control circuit is respectively electrically connected to the second voltage terminal, the tenth node, an eleventh node, the seventh node, the first voltage terminal, a twelfth node and the second clock signal terminal, is configured to control to connect the tenth node and the eleventh node under the control of the second voltage signal provided by the second voltage terminal, and control to connect the twelfth node and the first voltage terminal under the control of the potential of the seventh node, and control to connect the twelfth node and the second clock signal terminal under the control of the potential of the eleventh node, and control the potential of the eleventh node according to the potential of the twelfth node; the second control circuit is electrically connected to the second control node, the eleventh node, the second voltage terminal and the ninth node, and is configured to control the potential of the second control node under the control of the potential of the eleventh node, and control to connect the ninth node and the second control node under the control of the second voltage signal provided by the second voltage terminal.

Optionally, the first driving output circuit includes a sixteenth transistor and a second capacitor; a gate electrode of the sixteenth transistor is electrically connected to the first control node, a first electrode of the sixteenth transistor is electrically connected to the first voltage terminal, and a second electrode of the sixteenth transistor is electrically connected to the Nth stage of driving signal output terminal; a first terminal of the second capacitor is electrically connected to the first control node, and a second terminal of the second capacitor is electrically connected to the first voltage terminal; the second driving output circuit includes a seventeenth transistor and a third capacitor; a gate electrode of the seventeenth transistor is electrically connected to the second control node, a first electrode of the seventeenth transistor is electrically connected to the Nth stage of driving signal output terminal, and a second electrode of the seventeenth transistor is electrically connected to the second voltage terminal; a first terminal of the third capacitor is electrically connected to the Nth stage of driving signal output terminal, and a second terminal of the third capacitor is electrically connected to the second voltage terminal.

Optionally, the seventh node control circuit includes an eighteenth transistor and a nineteenth transistor; a gate electrode of the eighteenth transistor is electrically connected to the first clock signal terminal, a first electrode of the eighteenth transistor is electrically connected to the second voltage terminal, and a second electrode of the eighteenth transistor is electrically connected to the seventh node; a gate electrode of the nineteenth transistor is electrically connected to the ninth node, a first electrode of the nineteenth transistor is electrically connected to the seventh node, and a second electrode of the nineteenth transistor is electrically connected to the first clock signal terminal; the eighth node control circuit includes a twentieth transistor; a gate electrode of the twentieth transistor is electrically connected to the second voltage terminal, a first electrode of the twentieth transistor is electrically connected to the seventh node, and a second electrode of the twentieth transistor is electrically connected to the eighth node; the first control circuit includes a twenty-first transistor, a fourth capacitor, a twenty-second transistor, and a twenty-third transistor; a gate electrode of the twenty-first transistor is electrically connected to the eighth node, a first electrode of the twenty-first transistor is electrically connected to the second clock signal terminal, and a second electrode of the twenty-first transistor electrically connected to the second node; a first terminal of the fourth capacitor is electrically connected to the eighth node, and a second terminal of the fourth capacitor is electrically connected to the second node; a gate electrode of the twenty-second transistor is electrically connected to the second clock signal terminal, a first electrode of the twenty-second transistor is electrically connected to the second node, and a second electrode of the twenty-second transistor is electrically connected to the first control node; a gate electrode of the twenty-third transistor is electrically connected to the ninth node, a first electrode of the twenty-third transistor is electrically connected to the first control node, and a second electrode of the twenty-third transistor is electrically connected to the first voltage terminal.

Optionally, the ninth node control circuit includes a twenty-fourth transistor and a twenty-fifth transistor; a gate electrode of the twenty-fourth transistor is electrically connected to the first clock signal terminal, a first electrode of the twenty-fourth transistor is electrically connected to the (N−1)th stage of driving signal output terminal, and a second electrode of the twenty-fourth transistor is electrically connected to the ninth node; a gate electrode of the twenty-fifth transistor is electrically connected to the initial control terminal, a first electrode of the twenty-fifth transistor is electrically connected to the first voltage terminal, and a second electrode of the twenty-fifth transistor is electrically connected to the ninth node; the tenth node control circuit includes a twenty-sixth transistor; a gate electrode of the twenty-sixth transistor is electrically connected to the first clock signal terminal, a first electrode of the twenty-sixth transistor is electrically connected to the (N−1)th stage of driving signal output terminal, and a second electrode of the twenty-sixth is electrically connected to a tenth node; the eleventh node control circuit includes a twenty-seventh transistor, a twenty-eighth transistor, a twenty-ninth transistor and a fifth capacitor; a gate electrode of the twenty-seventh transistor is electrically connected to the second voltage terminal, a first electrode of the twenty-seventh transistor is electrically connected to the tenth node, and a second electrode of the twenty-seventh transistor is electrically connected to an eleventh node; a gate electrode of the twenty-eighth transistor is electrically connected to the seventh node, a first electrode of the twenty-eighth transistor is electrically connected to the first voltage terminal, and a second electrode of the twenty-eighth transistor is electrically connected to a twelfth node; a gate electrode of the twenty-ninth transistor is electrically connected to the eleventh node, a first electrode of the twenty-ninth transistor is electrically connected to the twelfth node, and a second electrode of the twenty-ninth transistor is electrically connected to the second clock signal terminal; a first terminal of the fifth capacitor is electrically connected to the twelfth node, and a second terminal of the fifth capacitor is electrically connected to the eleventh node; the second control circuit includes a thirtieth transistor and a thirty-first transistor; both a gate electrode of the thirtieth transistor and a first electrode of the thirtieth transistor are electrically connected to the eleventh node, and a second electrode of the thirtieth transistor is electrically connected to the second control node; a gate electrode of the thirty-first transistor is electrically connected to the second voltage terminal, a first electrode of the thirty-first transistor is electrically connected to the ninth node, and a second electrode of the thirty-first transistor is electrically connected to the second control node.

In a second aspect, an embodiment of the present disclosure provides a driving method applied to the driving circuit, includes: generating and outputting, by the driving signal generation circuit, the Nth stage of driving signal through the Nth stage of driving signal output terminal; controlling, by the gating circuit, to write the gating input signal provided by the gating input terminal into the first node under the control of the gating control signal provided by the gating control terminal; performing, by the output control circuit, the NAND operation on the Nth stage of driving signal and the potential of the second terminal of the output control circuit to obtain the first output signal; inverting, by the output circuit, the first output signal to obtain and provide the output driving signal through the output driving terminal; wherein N is a positive integer.

In a third aspect, an embodiment of the present disclosure provides a driving module, including a plurality of stages of driving circuits; wherein an Nth stage of driving circuit is electrically connected to a driving signal output terminal included in an (N−1)th stage of driving circuit; N is a positive integer.

In a fourth aspect, an embodiment of the present disclosure provides a display device including the driving module.

DETAILED DESCRIPTION

The following will clearly and completely describe the technical solutions in the embodiments of the present disclosure with reference to the accompanying drawings. Obviously, the described embodiments are only some of the embodiments of the present disclosure, not all of them. Based on the embodiments in the present disclosure, all other embodiments obtained by those ordinary skill in the art without making creative work belong to the protection scope of the present disclosure.

The transistors used in all the embodiments of the present disclosure may be thin film transistors or field effect transistors or other devices with the same characteristics. In the embodiments of the present disclosure, in order to distinguish the two electrodes of the transistor except the control electrode, one electrode is called the first electrode, and the other electrode is called the second electrode.

In actual operation, when the transistor is a thin film transistor or a field effect transistor, the control electrode may be a gate electrode, the first electrode may be a drain electrode, and the second electrode may be a source electrode; or, the control electrode may be a gate electrode, the first electrode may be a source electrode, and the second electrode may be a drain electrode.

Figure 1:
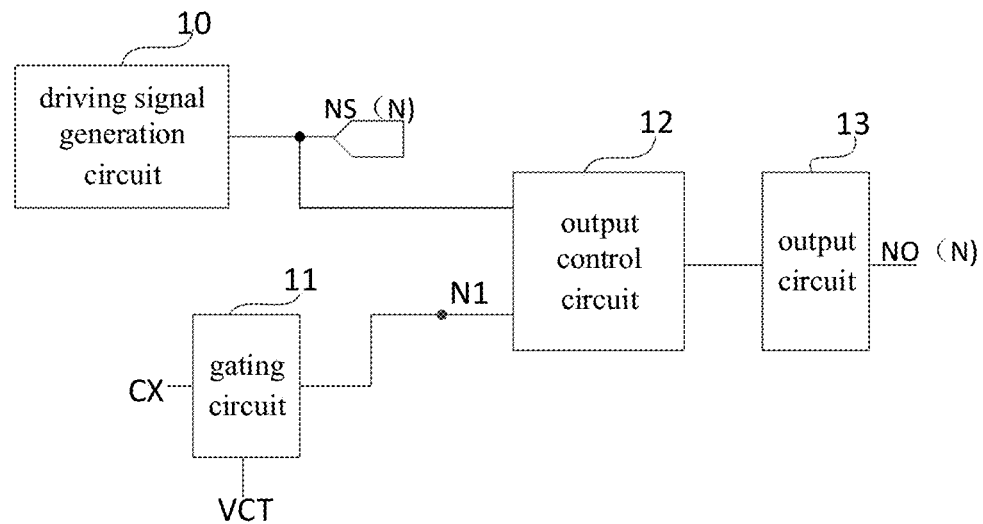
FIG. 1 is a structural diagram of a driving circuit according to an embodiment of the present disclosure.

As shown in FIG. 1, the driving circuit described in the embodiment of the present disclosure includes a driving signal generation circuit 10, a gating circuit 11, an output control circuit 12 and an output circuit 13;

The driving signal generation circuit 10 is electrically connected to the Nth stage of driving signal output terminal NS(N), and is configured to generate and output the Nth stage of driving signal through the Nth stage of driving signal output terminal NS(N);

The gating circuit 11 is electrically connected to the first node N1, a gating input terminal VCT and a gating control terminal CX respectively, and is configured to control to write the gating input signal provided by the gating input terminal VCT into the first node N1 under the control of a gating control signal provided by the gating control terminal CX;

A first terminal of the output control circuit 12 is electrically connected to the Nth stage of driving signal output terminal NS(N), and a second terminal of the output control circuit 12 is electrically connected to the first node N1, is configured to perform a NAND operation on the Nth stage of driving signal and the potential of the second terminal of the output control circuit 12 to obtain a first output signal;

The output circuit 13 is electrically connected to the output control circuit 12 and the output driving terminal NO(N) respectively, and is configured to invert the first output signal to obtain and provide an output driving signal through the output driving terminal NO(N);

N is a positive integer.

When the embodiment of the driving circuit shown in FIG. 1 of the present disclosure is in operation, the driving signal generation circuit 10 generates and outputs the Nth stage of driving signal through the Nth stage of driving signal output terminal NS(N), and the gating circuit 11 is configured to write the gating input signal into the first node N1 under the control of the gating control signal; the output control circuit 12 performs a NAND operation on the Nth stage of driving signal and the potential of the second terminal of the output control circuit 12 to obtain the first output signal, the output circuit 13 inverts the first output signal to obtain and provide an output driving signal through the output driving terminal NO(N).

An embodiment of the driving circuit shown in FIG. 1 of the present disclosure may be an Nth stage of driving circuit.

When the driving circuit shown in FIG. 1 of the present disclosure is working, within one frame, Before the supply phase of the Nth stage of driving signal, the gating circuit 11 writes the gating input signal provided by the gating input terminal VCT into the first node N1 under the control of the gating control signal;

When the gating input signal is a high voltage signal, in the supply phase of the Nth stage of driving signal, the Nth stage of driving signal output terminal NS(N) outputs a high voltage signal, and the output control circuit 12 outputs the first output signal that is a low voltage signal, and the output circuit 13 provides a high voltage signal through the output driving terminal NO (N), which can control the corresponding row of pixel circuits to update the pixel voltage;

When the gating input signal is a low voltage signal, in the supply phase of the Nth stage of driving signal, the Nth stage of driving signal output terminal NS (N) outputs a high voltage signal, and the output control circuit 12 outputs the first output signal that is a high voltage signal, and the output circuit 13 provides a low voltage signal through the output driving terminal NO (N), which can control the corresponding row of pixel circuits not to update the pixel voltage.

In the embodiment of the present disclosure, by controlling the gating input signal provided by the gating input terminal VCT, the update of the partial image of the display screen can be realized, thereby reducing power consumption, or the partial update of the display screen can realize the update of wearable products, mobile terminals, notebook and other OLED display products with ultra-low power consumption.

Figure 2:
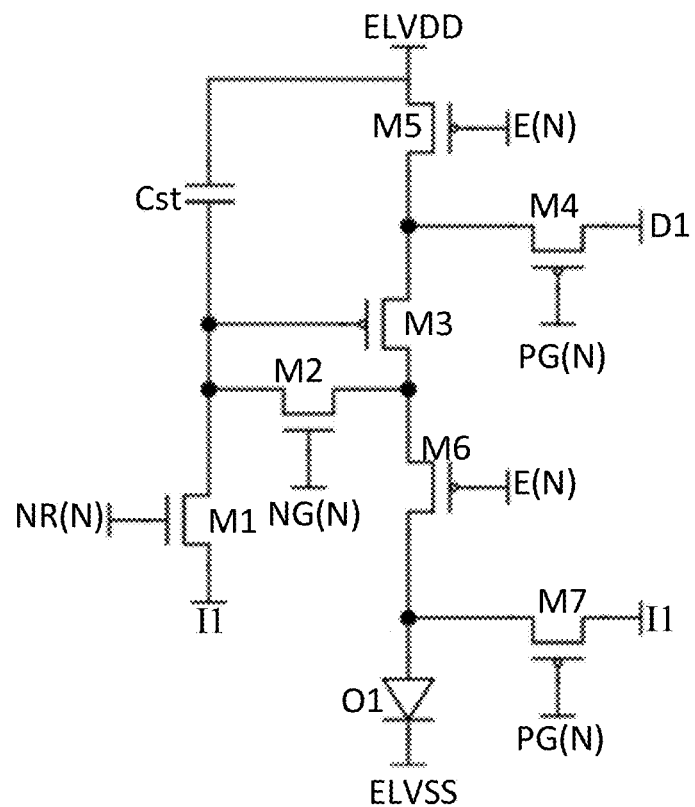
FIG. 2 is a circuit diagram of a related pixel circuit.

As shown in FIG. 2, the related pixel circuit may include a first display control transistor M1, a second display control transistor M2, a driving transistor M3, a fourth display control transistor M4, a fifth display control transistor M5, a sixth display control transistor M6, a seventh display control transistor M7, a storage capacitor Cst and an organic light emitting diode O1;

The gate electrode of M1 is electrically connected to the first reset terminal NR (N), the source electrode of M1 is electrically connected to the initial voltage terminal I1, and the drain electrode of M1 is electrically connected to the gate electrode of M3;

The gate electrode of M2 is electrically connected to the first scanning terminal NG (N), the source electrode of M2 is electrically connected to the gate electrode of M3, and the drain electrode of M2 is electrically connected to the drain electrode of M3;

The gate electrode of M4 is electrically connected to the second scanning terminal PG (N), the source electrode of M4 is electrically connected to the data line D1, and the drain electrode of M4 is electrically connected to the source electrode of M3;

The gate electrode of M5 is electrically connected to the light emitting control terminal E(N), the source electrode of M5 is electrically connected to the power supply voltage terminal ELVDD, and the drain electrode of M5 is electrically connected to the source electrode of M3;

The gate electrode of M6 is electrically connected to the light emitting control terminal E(N), the source electrode of M6 is electrically connected to the drain electrode of M3, the drain electrode of M6 is electrically connected to the anode of O1; the cathode of O1 is electrically connected to the low level terminal ELVSS;

The gate electrode of M7 is electrically connected to the second scanning terminal PG (N), the source electrode of M7 is electrically connected to the initial voltage terminal I1, and the drain electrode of M7 is electrically connected to the anode of O1.

During specific implementation, the first reset terminal NR(N) may be the (N−1)th stage of the first scanning terminal NG(N), but not limited thereto.

In the related pixel circuit shown in FIG. 2, M1 and M2 are n-type transistors, M3, M4, M5, M6 and M7 are all p-type transistors, M1 and M2 are IGZO TFTs with small leakage current, M3 and M4, M5, M6 and M7 are all LTPS TFTs.

In the related pixel circuit shown in FIG. 2, M1 and M2 are IGZO TFTs. When low-frequency display is used, the IGZO TFT can ensure that Cst can maintain the gate voltage of M3 for a long time.

In the related pixel circuit shown in FIG. 2, the second scanning terminal PG (N) is responsible for resetting the voltage of the anode of O1 and writing the data voltage on the data line into the source electrode of the driving transistor, and the first scanning terminal NG (N) is responsible for realizing the reset of Cst, extracting Vth (Vth is the threshold voltage of the driving transistor) and writing the data voltage into the gate electrode of the driving transistor.

During specific implementation, the first scanning signal provided by the first scanning terminal NG(N) and the second scanning signal provided by the second scanning terminal PG(N) may be opposite in phase, but not limited thereto.

The driving circuit described in at least one embodiment of the present disclosure can provide the first scanning terminal NG(N) with the first scanning signal through the output driving terminal NO(N), but is not limited thereto.

Figure 3:
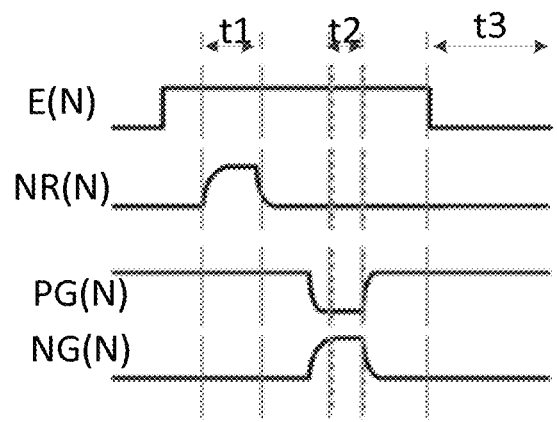
FIG. 3 is a working timing diagram of the related pixel circuit shown in FIG. 2.

As shown in FIG. 3, when the related pixel circuit shown in FIG. 2 is in operation, the display period may include a first display control phase t1, a second display control phase t2 and a third display control phase t3 which are set successively;

In the first display control phase t1, E(N) outputs a high voltage signal, NR(N) provides a high voltage signal, PG(N) provides a high voltage signal, NG(N) provides a low voltage signal, M5 and M6 are turned off, M1 is turned on, and the potential of the gate electrode of M3 is pulled down to an initial voltage Vinit; the initial voltage terminal I1 is configured to provide the initial voltage Vinit;

In the second display control phase t2, E(N) outputs a high voltage signal, NR(N) provides a low voltage signal, PG(N) provides a low voltage signal, NG(N) provides a high voltage signal, M5 and M6 are turned off, M1 is turned off, M2 is turned on, M4 is turned on, M2 and M3 form a diode structure, and the data voltage Vdata provided by the data line D1 charges Cst until M3 is turned off. At this time, the gate voltage of M3 is Vdata+Vth, and Vth is the threshold voltage of M3; M7 is turned on to reset the anode voltage of O1;

In the third display control phase t3, E(N) outputs a low voltage signal, NR(N) provides a low voltage signal, PG(N) provides a high voltage signal, NG(N) provides a low voltage signal, M5 and M6 are turned on, M3 drives O1 to emit light; O1 emits light according to the voltage setting of Vdata.

It can be seen from the working process of the related pixel circuit above that NG (N) can control whether the data voltage Vdata (the data voltage Vdata can be the pixel voltage) is written into the gate electrode of M3 in the second display control phase.

Figure 4:
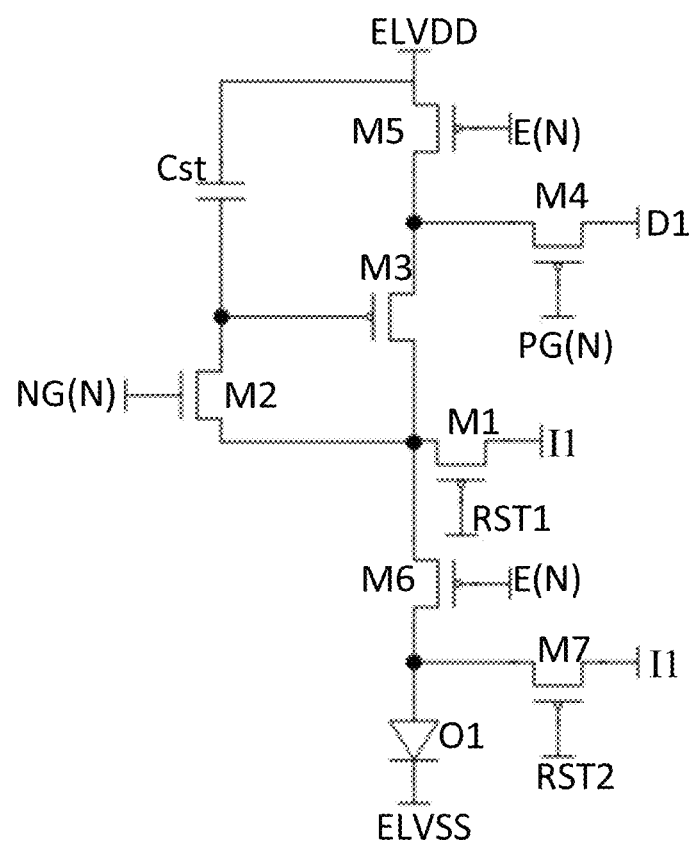
FIG. 4 is a circuit diagram of a related pixel circuit.

FIG. 4 is a circuit diagram of a related pixel circuit.

As shown in FIG. 4, the related pixel circuit may include a first display control transistor M1, a second display control transistor M2, a driving transistor M3, a fourth display control transistor M4, a fifth display control transistor M5, a sixth display control transistor M6, a seventh display control transistor M7, a storage capacitor Cst and an organic light emitting diode O1;

The gate electrode of M1 is electrically connected to the third reset terminal RST1, the source electrode of M1 is electrically connected to the initial voltage terminal I1, and the drain electrode of M1 is electrically connected to the drain electrode of M3;

The gate electrode of M2 is electrically connected to the first scanning terminal NG (N), the source electrode of M2 is electrically connected to the gate electrode of M3, and the drain electrode of M2 is electrically connected to the drain electrode of M3;

The gate electrode of M4 is electrically connected to the second scanning terminal PG (N), the source electrode of M4 is electrically connected to the data line D1, and the drain electrode of M4 is electrically connected to the source electrode of M3;

The gate electrode of M5 is electrically connected to the light emitting control terminal E(N), the source electrode of M5 is electrically connected to the power supply voltage terminal ELVDD, and the drain electrode of M5 is electrically connected to the source electrode of M3;

The gate electrode of M6 is electrically connected to the light emitting control terminal E(N), the source electrode of M6 is electrically connected to the drain electrode of M3, the drain electrode of M6 is electrically connected to the anode of O1; the cathode of O1 is electrically connected to the low level terminal ELVSS;

The gate electrode of M7 is electrically connected to the fourth reset terminal RST2, the source electrode of M7 is electrically connected to the initial voltage terminal I1, and the drain electrode of M7 is electrically connected to the anode of O1.

When the related pixel circuit shown in FIG. 4 is in operation, NG(N) can control whether the data voltage Vdata on the data line D1 is written into the gate electrode of the driving transistor M3.

In specific implementation, the first scanning signal provided by NG (N) can be configured to control to turn on or off the second transistor, to control whether the data voltage on the data line is written into the gate electrode of the driving transistor, thereby controlling whether to update the brightness of the current row of pixel circuits; when NG (N) outputs a high voltage signal, the second transistor is turned on to update the brightness of the current row of pixel circuits; when NG (N) outputs a low voltage signal, the second transistor is always turned off, the change of the data voltage on the data line will not be written into the gate electrode of the driving transistor, and the brightness of the organic light emitting diode will not change, that is, the display brightness of the current row of pixel circuits remains unchanged in the current frame. To sum up, it can be seen that the pixel brightness can be refreshed by controlling the N-type transistor to be turned on or off. Therefore, when some pixels are not to be refreshed, it is sufficient to ensure that the N-type transistor is turned off.

In at least one embodiment of the present disclosure, the gating circuit is configured to control to write the gating input signal provided by the gating input terminal into the first node when the potential of the (N−1)th stage of driving signal is the first voltage and the potential of the Nth stage driving signal is the second voltage.

In a specific implementation, the gating circuit can write the gating input signal into the first node when the potential of the (N−1)th stage of driving signal is the first voltage and the potential of the Nth stage of driving signal is the second voltage.

Optionally, the first voltage may be a high voltage, and the second voltage may be a low voltage, but not limited thereto. In at least one embodiment of the present disclosure, the first voltage may also be a low voltage, and the second voltage may be a high voltage.

Optionally, the gating circuit includes a first transistor; a gate electrode of the first transistor is electrically connected to the gating control terminal, and a first electrode of the first transistor is electrically connected to the first node, a second electrode of the first transistor is electrically connected to the gating input terminal.

Figure 5:
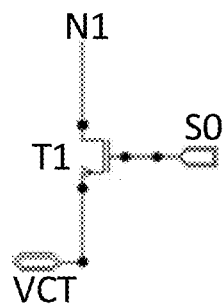
FIG. 5 is a circuit diagram of a gating circuit in a driving circuit according to an embodiment of the present disclosure.

As shown in FIG. 5, the gating circuit may include a first transistor T1;

The gate electrode of the first transistor T1 is electrically connected to the gating control terminal S0, the drain electrode of the first transistor T1 is electrically connected to the first node N1, and the source electrode of the first transistor T1 is electrically connected to the gating input terminal VCT;

T1 is a p-type transistor.

Figure 6:
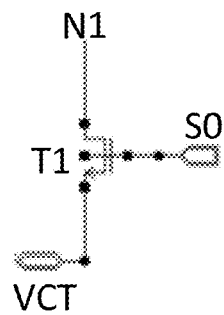
FIG. 6 is a circuit diagram of a gating circuit in a driving circuit according to an embodiment of the present disclosure.

As shown in FIG. 6, the gating circuit may include a first transistor T1;

The gate electrode of the first transistor T1 is electrically connected to the gating control terminal S0, the source electrode of the first transistor T1 is electrically connected to the first node N1, and the drain electrode of the first transistor T1 is electrically connected to the gating input terminal VCT;

T1 is an n-type transistor.

Optionally, the gating control terminal includes a first gating control terminal and a second gating control terminal; the gating circuit includes a first transistor and a second transistor;

A gate electrode of the first transistor is electrically connected to the first gating control terminal, a first electrode of the first transistor is electrically connected to the first node, and a second electrode of the first transistor is electrically connected to a first electrode of the second transistor;

A gate electrode of the second transistor is electrically connected to the second gating control terminal, and a second electrode of the second transistor is electrically connected to the gating input terminal;

The first gating control terminal is the (N−1)th stage of driving signal output terminal, the second gating control terminal is the Nth stage of driving signal output terminal, the first transistor is an n-type transistor, and the second transistor is a p-type transistor; or, The first gating control terminal is the N-th stage of driving signal output terminal, the second gating control terminal is the (N−1)th stage of driving signal output terminal, the first transistor is a p-type transistor, and the second transistor is an n-type transistor; or, The first gating control terminal is the (N−1)th stage of second node, the second gating control terminal is the Nth stage of driving signal output terminal, and the first transistor and the second transistor are p-type transistors; or, The first gating control terminal is the Nth stage of driving signal output terminal, the second gating control terminal is the (N−1)th stage of second node, and both the first transistor and the second transistor are p-type transistors; or, The first gating control terminal is connected to an inversion signal of the (N−1)th stage of driving signal, the second gating control terminal is the Nth stage of driving signal output terminal, the first transistor and the second transistor are both p-type transistors; or, The first gating control terminal is the Nth stage of driving signal output terminal, and the second gating control terminal is connected to the inversion signal of the (N−1)th stage of driving signal; the first transistor and the second transistor are both p-type transistors; or, The first gating control terminal is the (N−1)th stage of driving signal terminal, the second gating control terminal is connected to the inversion signal of the Nth stage of driving signal, and the first transistor and the second transistor are both n-type transistors; or, The first gating control terminal is connected to the inversion signal of the Nth stage of driving signal, the second gating control terminal is the (N−1)th stage of driving signal terminal, and the first transistor and the second transistor are both n-type transistors.

Figure 7:
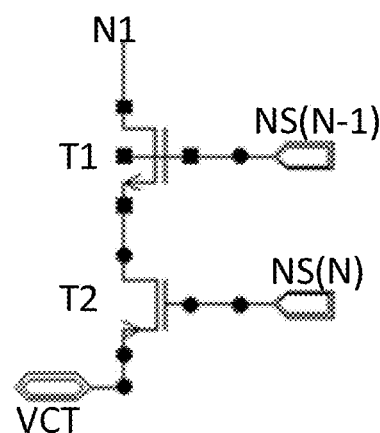
FIG. 7 is a circuit diagram of a gating circuit in a driving circuit according to an embodiment of the present disclosure.

As shown in FIG. 7, the gating circuit may include a first transistor T1 and a second transistor T2;

The gate electrode of the first transistor T1 is electrically connected to the (N−1)th stage of driving signal output terminal NS(N−1), the source electrode of the first transistor T1 is electrically connected to the first node N1, and the drain electrode of the first transistor T1 is electrically connected to the drain electrode of the second transistor T2;

The gate electrode of the second transistor T2 is electrically connected to the Nth stage of driving signal output terminal NS(N), and the source electrode of the second transistor T2 is electrically connected to the gating input terminal VCT;

T1 is an n-type transistor, and T2 is a p-type transistor.

Figure 8:
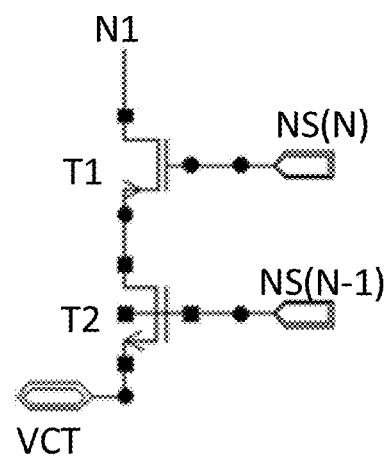
FIG. 8 is a circuit diagram of a gating circuit in a driving circuit according to an embodiment of the present disclosure.

As shown in FIG. 8, the gating circuit may include a first transistor T1 and a second transistor T2;

The gate electrode of the first transistor T1 is electrically connected to the Nth stage of driving signal output terminal NS(N), the drain electrode of the first transistor T1 is electrically connected to the first node N1, and the source electrode of the first transistor T1 is electrically connected to the source electrode of the second transistor T2;

The gate electrode of the second transistor T2 is electrically connected to the (N−1)th stage of driving signal output terminal NS(N−1), and the drain electrode of the second transistor T2 is electrically connected to the gating input terminal VCT;

T1 is a p-type transistor, and T2 is an n-type transistor.

Figure 9:
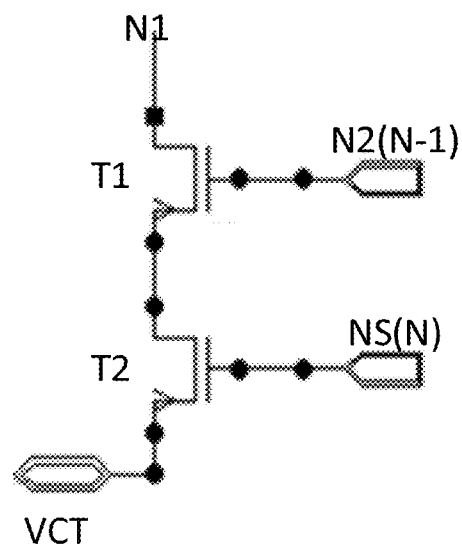
FIG. 9 is a circuit diagram of a gating circuit in a driving circuit according to an embodiment of the present disclosure.

As shown in FIG. 9, the gating circuit may include a first transistor T1 and a second transistor T2;

The gate electrode of the first transistor T1 is electrically connected to the (N−1)th stage of second node N2(N−1), the drain electrode of the first transistor T1 is electrically connected to the first node N1, and the source electrode of the first transistor T1 is electrically connected to the drain electrode of the second transistor T2;

The gate electrode of the second transistor T2 is electrically connected to the Nth stage of driving signal output terminal NS(N), and the source electrode of the second transistor T2 is electrically connected to the gating input terminal VCT;

T1 is a p-type transistor, and T2 is a p-type transistor.

In at least one embodiment of the present disclosure, the (N−1)th stage of second node N2(N−1) may be a second node in the (N−1)th stage of driving circuit.

Figure 10:
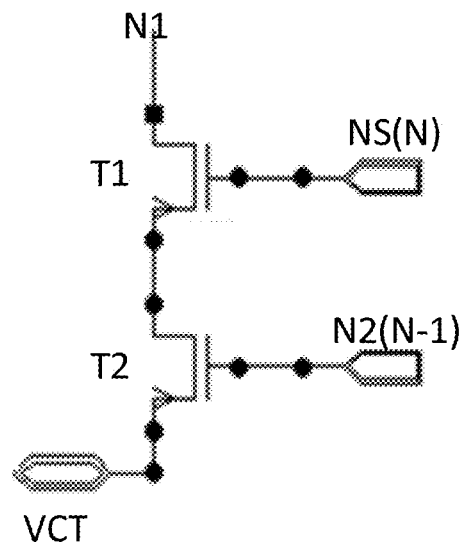
FIG. 10 is a circuit diagram of a gating circuit in a driving circuit according to an embodiment of the present disclosure.

As shown in FIG. 10, the gating circuit may include a first transistor T1 and a second transistor T2;

The gate electrode of the first transistor T1 is electrically connected to the Nth stage of driving signal output terminal NS(N), the drain electrode of the first transistor T1 is electrically connected to the first node N1, and the source electrode of the first transistor T1 is electrically connected to the drain electrode of the second transistor T2;

The gate electrode of the second transistor T2 is electrically connected to the (N−1)th stage of second node N2(N−1), and the source electrode of the second transistor T2 is electrically connected to the gating input terminal VCT;

T1 is a p-type transistor, and T2 is a p-type transistor.

Figure 11:
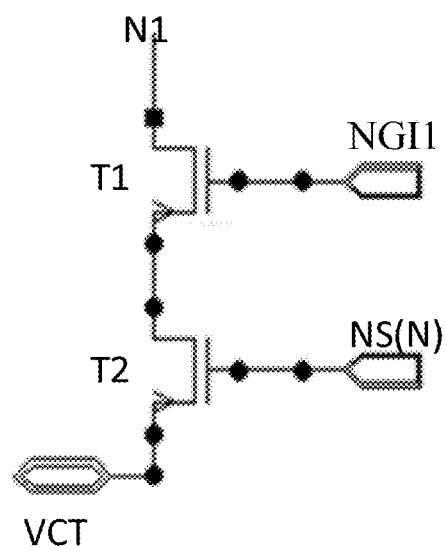
FIG. 11 is a circuit diagram of a gating circuit in a driving circuit according to an embodiment of the present disclosure.

As shown in FIG. 11, the gating circuit may include a first transistor T1 and a second transistor T2;

The gate electrode of the first transistor T1 is electrically connected to the first inverting driving signal terminal NGI1, the drain electrode of the first transistor T1 is electrically connected to the first node N1, and the source electrode of the first transistor T1 is electrically connected to the drain electrode of the second transistor T2; the first inverting driving signal provided by the first inverting driving signal terminal NGI1 is inversed in phase to the (N−1)th stage of driving signal provided by the (N−1)th stage of driving signal output terminal NS(N−1);

The gate electrode of the second transistor T2 is electrically connected to the Nth stage of driving signal output terminal NS(N), and the source electrode of the second transistor T2 is electrically connected to the gating input terminal VCT;

T1 is a p-type transistor, and T2 is a p-type transistor.

Figure 12:
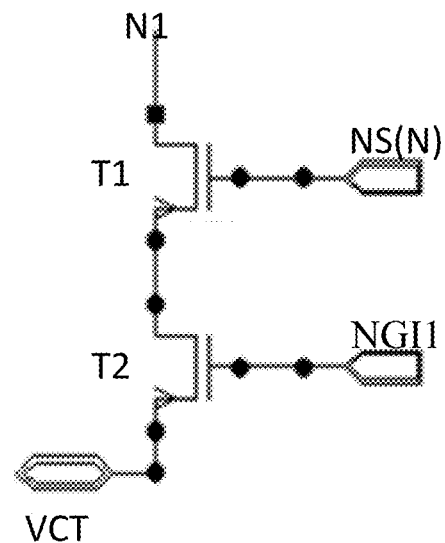
FIG. 12 is a circuit diagram of a gating circuit in a driving circuit according to an embodiment of the present disclosure.

As shown in FIG. 12, the gating circuit may include a first transistor T1 and a second transistor T2;

The gate electrode of the first transistor T1 is electrically connected to the Nth stage of driving signal output terminal NS(N), the drain electrode of the first transistor T1 is electrically connected to the first node N1, and the source electrode of the first transistor T1 is electrically connected to the drain electrode of the second transistor T2;

The gate electrode of the second transistor T2 is electrically connected to the first inversing driving signal terminal NGI1, and the source electrode of the second transistor T2 is electrically connected to the gating input terminal VCT; the first inversing driving signal provided by the first inversing driving signal terminal NGI1 is inverted in phase to the (N−1)th stage of driving signal provided by the (N−1)th stage of driving signal output terminal NS(N−1);

T1 is a p-type transistor, and T2 is a p-type transistor.

Figure 13:
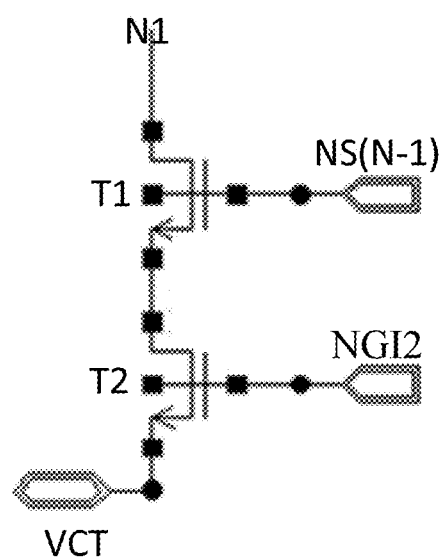
FIG. 13 is a circuit diagram of a gating circuit in a driving circuit according to an embodiment of the present disclosure.

As shown in FIG. 13, the gating circuit may include a first transistor T1 and a second transistor T2;

The gate electrode of the first transistor T1 is electrically connected to the (N−1)th stage of driving signal output terminal NS(N−1), the source electrode of the first transistor T1 is electrically connected to the first node N1, and the drain electrode of the first transistor T1 is electrically connected to the source electrode of the second transistor T2;

The gate electrode of the second transistor T2 is electrically connected to the second inverting driving signal terminal NGI2, and the drain electrode of the second transistor T2 is electrically connected to the gating input terminal VCT; the second inverting driving signal provided by the second inverting driving signal terminal NGI2 is inversed in phase to the Nth stage of driving signal provided by the Nth stage of driving signal output terminal NS(N);

T1 is an n-type transistor, and T2 is an n-type transistor.

Figure 14:
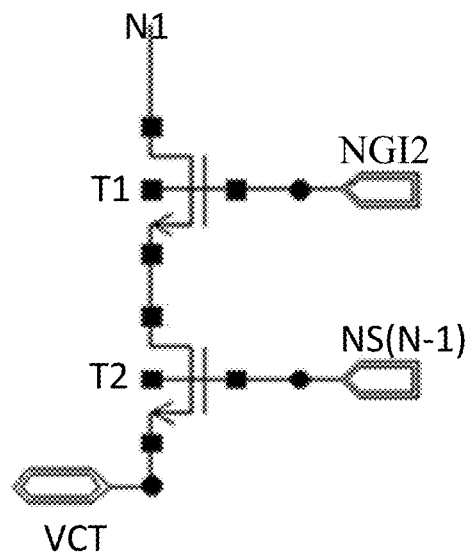
FIG. 14 is a circuit diagram of a gating circuit in a driving circuit according to an embodiment of the present disclosure.

As shown in FIG. 14, the gating circuit may include a first transistor T1 and a second transistor T2;

The gate electrode of the first transistor T1 is electrically connected to the second inverting driving signal terminal NGI2, the source electrode of the first transistor T1 is electrically connected to the first node N1, and the drain electrode of the first transistor T1 is electrically connected to the source electrode of the second transistor T2; the second inverting driving signal provided by the second inverting driving signal terminal NGI2 is inversed in phase to the Nth stage of driving signal provided by the Nth stage of driving signal output terminal NS(N);

The gate electrode of the second transistor T2 is electrically connected to the (N−1)th stage of driving signal output terminal NS(N−1), and the drain electrode of the second transistor T2 is electrically connected to the gating input terminal VCT;

T1 is an n-type transistor, and T2 is an n-type transistor.

Figure 15:
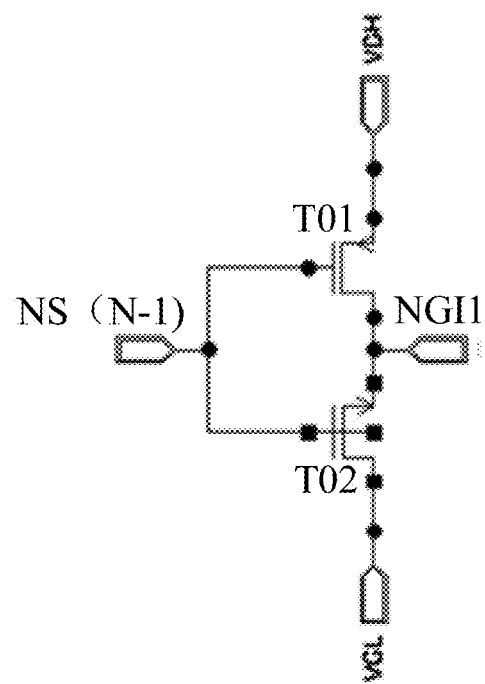
FIG. 15 is a circuit diagram of an inverter according to at least one embodiment of the present disclosure.

As shown in FIG. 15, the (N−1)th stage of driving signal provided by the (N−1)th stage driving signal output terminal NS (N−1) can be inverted by the first inverter to obtain the first inverted driving signal provided by the first inversing driving signal terminal NGI1;

The first inverter includes a first inversion control transistor T01 and a second inversion control transistor T02;

T01 is a p-type transistor, and T02 is an n-type transistor.

Figure 16:
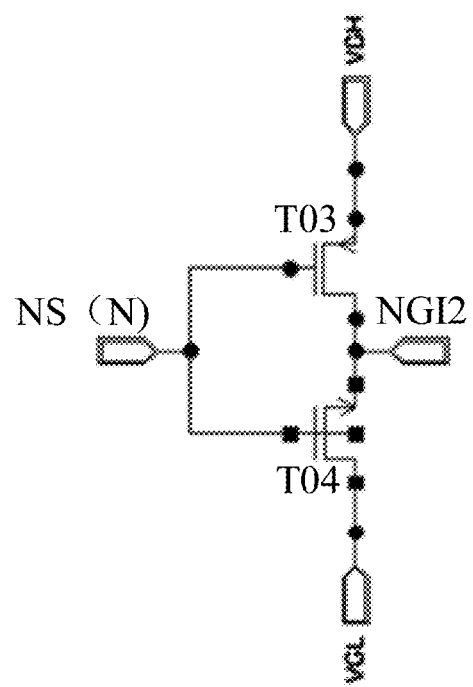
FIG. 16 is a circuit diagram of an inverter according to at least one embodiment of the present disclosure.

As shown in FIG. 16, the Nth stage of driving signal provided by the Nth stage of driving signal output terminal NS(N) can be inverted by the second inverter to obtain the second inverting driving signal provided by the second inverting driving signal terminal NGI2;

The second inverter includes a third inversion control transistor T03 and a fourth inversion control transistor T04;

T03 is a p-type transistor, and T04 is an n-type transistor.

The driving circuit described in at least one embodiment of the present disclosure may further include an initialization circuit and a first voltage maintenance circuit;

The initialization circuit is electrically connected to the initial control terminal, the first voltage terminal and the first node, and is configured to control to connect the first node and the first voltage terminal under the control of the initial control signal provided by the initial control terminal;

The first terminal of the first voltage maintenance circuit is electrically connected to the first node, the second terminal of the first voltage maintenance circuit is electrically connected to the DC voltage terminal or the third node, and the first voltage maintenance circuit is configured to maintain the potential of the first node.

In specific implementation, the driving circuit may also include an initialization circuit and a first voltage maintenance circuit; the initialization circuit controls to connect the first node and the first voltage terminal under the control of the initial control signal, and the first potential maintenance circuit maintains the potential of the first node.

Figure 17:
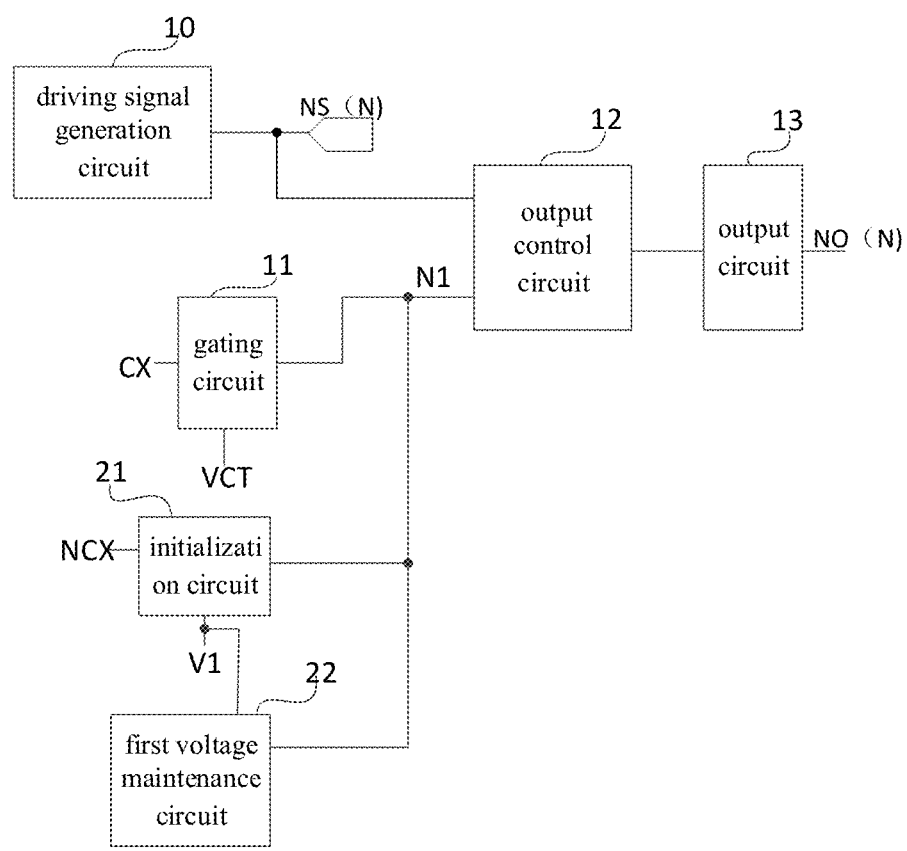
FIG. 17 is a structural diagram of a driving circuit according to at least one embodiment of the present disclosure.

As shown in FIG. 17, on the basis of at least one embodiment of the driving circuit shown in FIG. 1, the driving circuit described in at least one embodiment of the present disclosure may further include an initialization circuit 21 and a first voltage maintenance circuit 22;

The initialization circuit 21 is electrically connected to the initial control terminal NCX, the first voltage terminal V1 and the first node N1 respectively, and is configured to control to connect the first node N1 and the first voltage terminal V1 under the control of the initial control signal provided by the initial control terminal NCX;

The first terminal of the first voltage maintenance circuit 22 is electrically connected to the first node N1, the second terminal of the first voltage maintenance circuit 22 is electrically connected to the first voltage terminal V1, and the first voltage maintenance circuit 22 is configured to maintain the potential of the first node N1.

When at least one embodiment of the driving circuit shown in FIG. 17 is in operation, NCX provides an effective voltage signal at the beginning of one frame, and the initialization circuit 21 controls to connect the first node N1 and the first voltage terminal V1.

In at least one embodiment of the present disclosure, the first voltage terminal may be a high voltage terminal, but not limited thereto.

The driving circuit according to at least one embodiment of the present disclosure may further include a second voltage maintenance circuit, and the second voltage maintenance circuit includes a first inverter, a second inverter and a maintenance control circuit;

An input terminal of the first inverter is electrically connected to the first node, an output terminal of the first inverter is electrically connected to the third node, and an input terminal of the second inverter is electrically connected to the third node, and an output terminal of the second inverter is electrically connected to the fourth node;

The first inverter is configured to invert the potential of the first node, and output the inverted potential of the first node through an output terminal of the first inverter;

The second inverter is configured to invert the potential of the input terminal of the second inverter, and output the inverted potential through the output terminal of the second inverter;

The maintenance control circuit is electrically connected to the maintenance control terminal, the fourth node and the first node, and is configured to control to connect or disconnect the fourth node and the first node under the control of the maintenance control signal provided by the maintenance control terminal.

In specific implementation, the driving circuit may also include a second voltage maintenance circuit, the second voltage maintenance circuit includes a first inverter, a second inverter and a maintenance control circuit, and the first inverter reverses the potential of the first node, the second inverter reverses the potential of the input terminal of the second inverter, and the maintenance control circuit controls to connect or disconnect the fourth node and the first node under the control of the maintenance control signal;

The maintenance control circuit may control to disconnect the fourth node from the first node when the gating circuit controls to write the gating input signal into the first node, so as not to affect the potential of the first node.

When the driving circuit described in at least one embodiment of the present disclosure is working, by adding a second voltage maintenance circuit, the first inverter and the second inverter included in the second voltage maintenance circuit can control to connect the input terminal of the second inverter and the high voltage terminal when the potential of the first node is a high voltage, so that the potential of the output terminal of the second inverter is higher than the potential of the first node, and when the potential of the first node is a low voltage, control to connect the output terminal of the second inverter and the low voltage terminal, so that the potential of the output terminal of the second inverter is higher than the potential of the first node, and when the potential of the first node is a low voltage, control to connect the output terminal of the second inverter and the low voltage terminal, so that the potential of the output terminal of the second inverter is lower than the potential of the first node, and the maintenance control circuit included in the second voltage maintenance circuit controls to connect the output terminal of the second inverter and the first node in the Nth stage of driving signal output phase, thereby increasing the absolute value of the potential of the first node, so that the first node can better control a transistor whose gate electrode is electrically connected to the first node included in the output control circuit.

Figure 18:
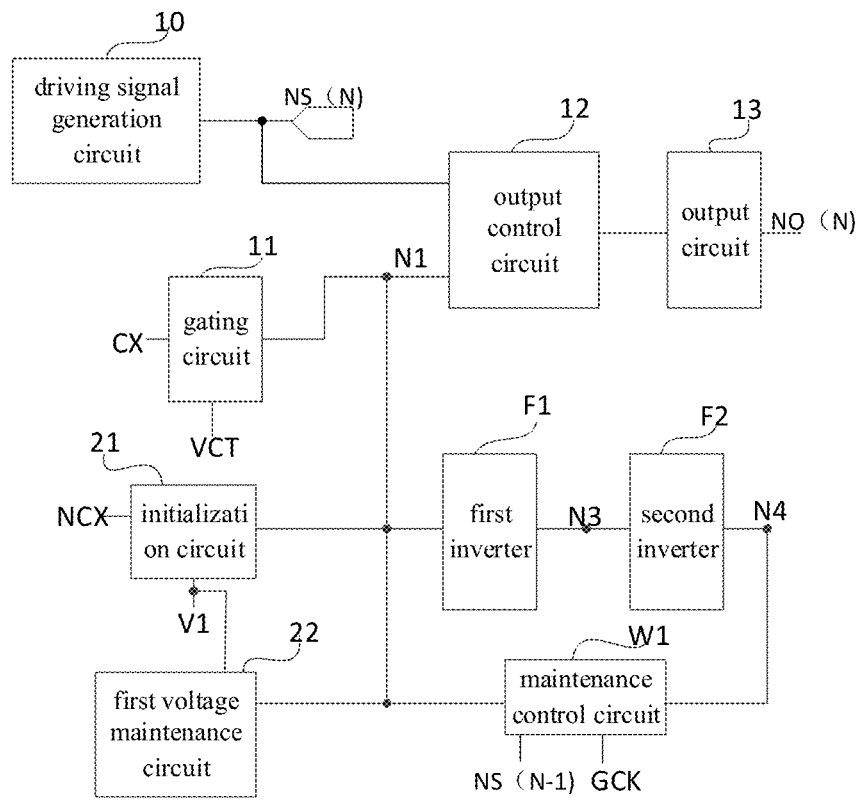
FIG. 18 is a structural diagram of a driving circuit according to at least one embodiment of the present disclosure.

As shown in FIG. 18, on the basis of at least one embodiment of the driving circuit shown in FIG. 17, the driving circuit described in at least one embodiment of the present disclosure may further include a second voltage maintenance circuit, and the second voltage maintenance circuit includes a first inverter F1, a second inverter F2 and a maintenance control circuit W1; the maintenance control terminal includes an (N−1)th stage of driving signal output terminal NS (N−1) and a first clock signal terminal GCK;

The input terminal of the first inverter F1 is electrically connected to the first node N1, and the output terminal of the first inverter F1 is electrically connected to the third node N3;

The input terminal of the second inverter F2 is electrically connected to the third node N3, and the output terminal of the second inverter F2 is electrically connected to the fourth node N4;

The first inverter F1 is configured to invert the potential of the first node N1, and output the inverted potential of the first node through the output terminal of the first inverter F1;

The second inverter F2 is configured to invert the potential of the input terminal of the second inverter, and output the inverted potential through the output terminal of the second inverter F2;

The maintenance control circuit W1 is electrically connected to the (N−1)th stage of driving signal output terminal NS(N−1), the first clock signal terminal GCK, the fourth node N4 and the first node N1, is configured to control to connect or disconnect the fourth node N4 and the first node N1 under the control of the (N−1)th stage of driving signal provided by the (N−1)th stage of driving signal output terminal NS(N−1), is configured to control to connect or disconnect the fourth node N4 and the first node N1 under the control of the first clock signal provided by the first clock signal terminal GCK.

In at least one embodiment shown in FIG. 18, the (N−1)th stage of driving signal output terminal may be replaced by a second clock signal terminal, but not limited thereto.

In at least one embodiment of the present disclosure, the driving circuit may further include a second voltage maintenance circuit;

The first node is electrically connected to the second terminal of the output control circuit through the second voltage maintenance circuit;

The second voltage maintenance circuit includes a first inverter, a second inverter and a maintenance control circuit;

The input terminal of the first inverter is electrically connected to the first node, the output terminal of the first inverter is electrically connected to the third node, and the input terminal of the second inverter is electrically connected to the third node, and the output terminal of the second inverter is electrically connected to the fourth node and the second terminal of the output control circuit;

The first inverter is configured to invert the potential of the first node, and output the inverted potential of the first node through the output terminal of the first inverter, and the second inverter is configured to invert the potential of the input terminal of the second inverter, and output the inverted potential through the output terminal of the second inverter;

The maintenance control circuit is electrically connected to the maintenance control terminal, the fourth node and the first node, and is configured to control to connect or disconnect the fourth node and the first node under the control of the maintenance control signal provided by the maintenance control terminal.

In specific implementation, the driving circuit may also include a second voltage maintenance circuit, the first node may be electrically connected to the second terminal of the output control circuit through the second voltage maintenance circuit, and the second voltage maintenance circuit may include a first inverter, a second inverter and a maintenance control circuit; the first inverter inverts the potential of the first node, and the second inverter inverts the potential of the input terminal of the second inverter; the maintenance control circuit controls to connect or disconnect the fourth node and the first node under the control of the maintenance control signal provided by the maintenance control terminal;

The maintenance control circuit may control to disconnect the fourth node from the first node when the gating circuit controls to write the gating input signal into the first node.

When the driving circuit described in at least one embodiment of the present disclosure is working, by adding a second voltage maintenance circuit, the first inverter and the second inverter included in the second voltage maintenance circuit can control to connect the fourth node and the high voltage terminal when the potential of the first node is high, so that the potential of the fourth node is higher than the potential of the first node, and can control to connect the fourth node and the low voltage terminal when the potential of the first node is low voltage, so that the potential of the fourth node is lower than the potential of the first node, the fourth node can better control the transistor whose gate electrode is electrically connected to the fourth node included in the output control circuit.

Figure 19:
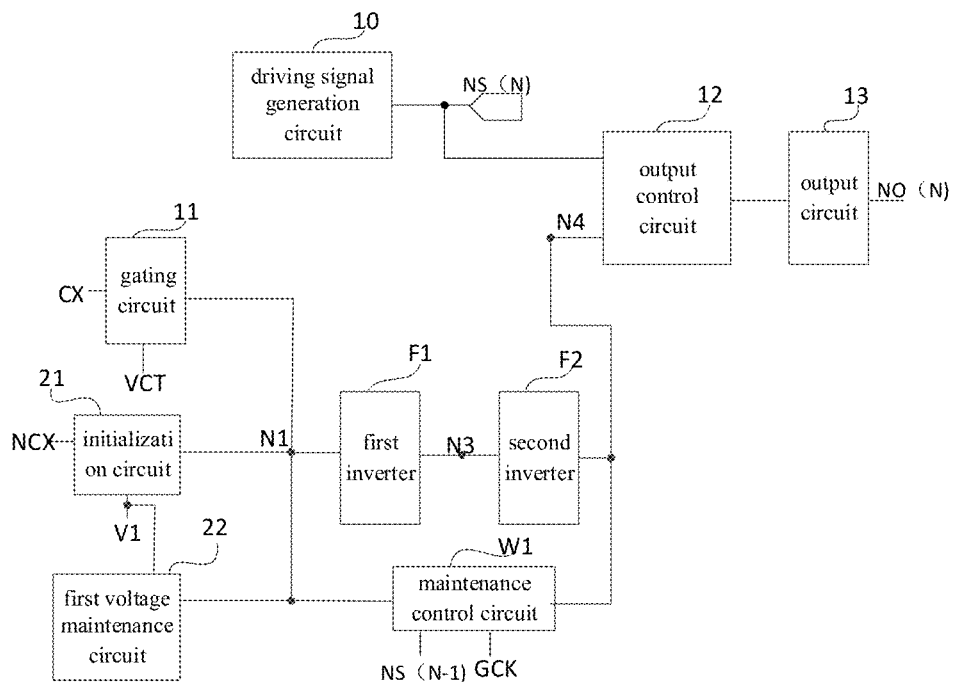
FIG. 19 is a structural diagram of a driving circuit according to at least one embodiment of the present disclosure.

As shown in FIG. 19, on the basis of at least one embodiment of the driving circuit shown in FIG. 17, the driving circuit may further include a second voltage maintenance circuit; the maintenance control terminal includes an (N−1)th stage of driving signal output terminal NS (N−1) and the first clock signal terminal GCK;

The first node N1 is electrically connected to the second terminal of the output control circuit 12 through the second voltage maintenance circuit;

The second voltage maintenance circuit includes a first inverter F1, a second inverter F2 and a maintenance control circuit W1;

The input terminal of the first inverter F1 is electrically connected to the first node N1, and the output terminal of the first inverter F1 is electrically connected to the third node N3;

The input terminal of the second inverter F2 is electrically connected to the third node N3, and the output terminal of the second inverter F2 is electrically connected to the fourth node N4 and the second terminal of the output control circuit 12;

The first inverter F1 is configured to invert the potential of the first node N1, and output the inverted potential of the first node through the output terminal of the first inverter F1;

The second inverter F2 is configured to invert the potential of the input terminal of the second inverter, and output the inverted potential through the output terminal of the second inverter F2;

The maintenance control circuit W1 is electrically connected to the (N−1)th stage of driving signal output terminal NS(N−1), the first clock signal terminal GCK, the fourth node N4 and the first node N1, is configured to control to connect or disconnect the fourth node N4 and the first node N1 under the control of the (N−1)th stage of driving signal provided by the (N−1)th stage of driving signal output terminal NS(N−1), and control to connect or disconnect the fourth node N4 and the first node N1 under the control of the first clock signal provided by the first clock signal terminal GCK.

In at least one embodiment shown in FIG. 19, the (N−1)th stage of driving signal output terminal may be replaced by a second clock signal terminal, but not limited thereto.

Optionally, the maintenance control terminal includes a first maintenance control terminal and a second maintenance control terminal;

The maintenance control circuit includes a third transistor and a fourth transistor;

A gate electrode of the third transistor is electrically connected to the first maintenance control terminal, a first electrode of the third transistor is electrically connected to the first node, and a second electrode of the third transistor is electrically connected to the fourth node;

A gate electrode of the fourth transistor is electrically connected to the second maintenance control terminal, a first electrode of the fourth transistor is electrically connected to the fourth node, and a second electrode of the fourth transistor is electrically connected to the first node;

The third transistor is a p-type transistor, and the fourth transistor is an n-type transistor;

The first maintenance control terminal is the (N−1)th stage of driving signal terminal, and the second maintenance control terminal is the first clock signal terminal; or, The first maintenance control terminal is a second clock signal terminal, and the second maintenance control terminal is a first clock signal terminal.

Optionally, the first inverter includes a fifth transistor and a sixth transistor, and the second inverter includes a seventh transistor and an eighth transistor;

Agate electrode of the fifth transistor is electrically connected to the first node, a first electrode of the fifth transistor is electrically connected to the first voltage terminal, and a second electrode of the fifth transistor is electrically connected to the third node;

A gate electrode of the sixth transistor is electrically connected to the first node, a first electrode of the sixth transistor is electrically connected to the third node, and a second electrode of the sixth transistor is electrically connected to the second voltage terminal;

The fifth transistor is a p-type transistor, and the sixth transistor is an n-type transistor;

A gate electrode of the seventh transistor is electrically connected to the third node, a first electrode of the seventh transistor is electrically connected to the first voltage terminal, and a second electrode of the seventh transistor is electrically connected to the fourth node;

A gate electrode of the eighth transistor is electrically connected to the third node, a first electrode of the eighth transistor is electrically connected to the fourth node, and a second electrode of the eighth transistor is electrically connected to the second voltage terminal;

The seventh transistor is a p-type transistor, and the eighth transistor is an n-type transistor.

Optionally, the initialization circuit includes a ninth transistor, and the first voltage maintenance circuit includes a first capacitor;

A gate electrode of the ninth transistor is electrically connected to the initial control terminal, a first electrode of the ninth transistor is electrically connected to the first voltage terminal, and a second electrode of the ninth transistor is electrically connected to the first node;

A first terminal of the first capacitor is electrically connected to the first node, and a second terminal of the first capacitor is electrically connected to the DC voltage terminal or the third node.

Optionally, the output control circuit includes a tenth transistor, an eleventh transistor, a twelfth transistor and a thirteenth transistor;

Agate electrode of the tenth transistor is electrically connected to the Nth stage of driving signal output terminal, a first electrode of the tenth transistor is electrically connected to the first voltage terminal, and a second electrode of the tenth transistor is electrically connected to the fifth node;

A gate electrode of the eleventh transistor is electrically connected to the first node, a first electrode of the eleventh transistor is electrically connected to the first voltage terminal, and a second electrode of the eleventh transistor is electrically connected to the fifth node;

A gate electrode of the twelfth transistor is electrically connected to the Nth stage of driving signal output terminal, a first electrode of the twelfth transistor is electrically connected to the fifth node, and a second electrode of the twelfth transistor is electrically connected to the sixth node;

A gate electrode of the thirteenth transistor is electrically connected to the first node, a first electrode of the thirteenth transistor is electrically connected to the sixth node, and a second electrode of the thirteenth transistor is electrically connected to the second voltage terminal;

The tenth transistor and the eleventh transistor are p-type transistors, and the twelfth transistor and the thirteenth transistor are n-type transistors.

Optionally, the output control circuit includes a tenth transistor, an eleventh transistor, a twelfth transistor and a thirteenth transistor;

Agate electrode of the tenth transistor is electrically connected to the Nth stage of driving signal output terminal, a first electrode of the tenth transistor is electrically connected to the first voltage terminal, and a second electrode of the tenth transistor is electrically connected to the fifth node;

A gate electrode of the eleventh transistor is electrically connected to the fourth node, a first electrode of the eleventh transistor is electrically connected to the first voltage terminal, and a second electrode of the eleventh transistor is electrically connected to the fifth node;

A gate electrode of the twelfth transistor is electrically connected to the Nth stage of driving signal output terminal, a first electrode of the twelfth transistor is electrically connected to the fifth node, and a second electrode of the twelfth transistor is electrically connected to the sixth node;

A gate electrode of the thirteenth transistor is electrically connected to the fourth node, a first electrode of the thirteenth transistor is electrically connected to the sixth node, and a second electrode of the thirteenth transistor is electrically connected to the second voltage terminal;

The tenth transistor and the eleventh transistor are p-type transistors, and the twelfth transistor and the thirteenth transistor are n-type transistors.

Optionally, the output circuit includes a fourteenth transistor and a fifteenth transistor;

A gate electrode of the fourteenth transistor is electrically connected to the fifth node, a first electrode of the fourteenth transistor is electrically connected to the first voltage terminal, and a second electrode of the fourteenth transistor is connected to the output driving terminal;

Agate electrode of the fifteenth transistor is electrically connected to the fifth node, a first electrode of the fifteenth transistor is electrically connected to the output driving terminal, and a second electrode of the fifteenth transistor is electrically connected to the second voltage terminal.

In at least one embodiment of the present disclosure, the driving signal generation circuit may include a first control node control circuit, a second control node control circuit, a first driving output circuit, and a second driving output circuit;

The first control node control circuit is configured to control the potential of the first control node;

The second control node control circuit is configured to control the potential of the second control node;

The first driving output circuit is electrically connected to the first control node, the first voltage terminal and the Nth stage of driving signal output terminal respectively, and is configured to control to connect the Nth stage of driving signal output terminal and the first voltage terminal under the control of the potential of the first control node;

The second driving output circuit is electrically connected to the second control node, the second voltage terminal, and the Nth stage of driving signal output terminal, and is configured to control to connect the Nth stage of driving signal output terminal and the second voltage terminal under the control of the potential of the second control node.

In specific implementation, the driving signal generation circuit may include a first control node control circuit, a second control node control circuit, a first driving output circuit and a second driving output circuit, the first control node control circuit is configured to control the potential of the first control node; the second control node control circuit controls the potential of the second control node; the first driving output circuit controls to connect the Nth stage of driving signal output terminal and the first voltage terminal under the control of the potential of the first control node; the second driving output circuit controls to connect the Nth stage of driving signal output terminal and the second voltage terminal under the control of the potential of the second control node.

Optionally, the first voltage terminal may be a high voltage terminal, and the second voltage terminal may be a low voltage terminal, but not limited thereto.

Figure 20:
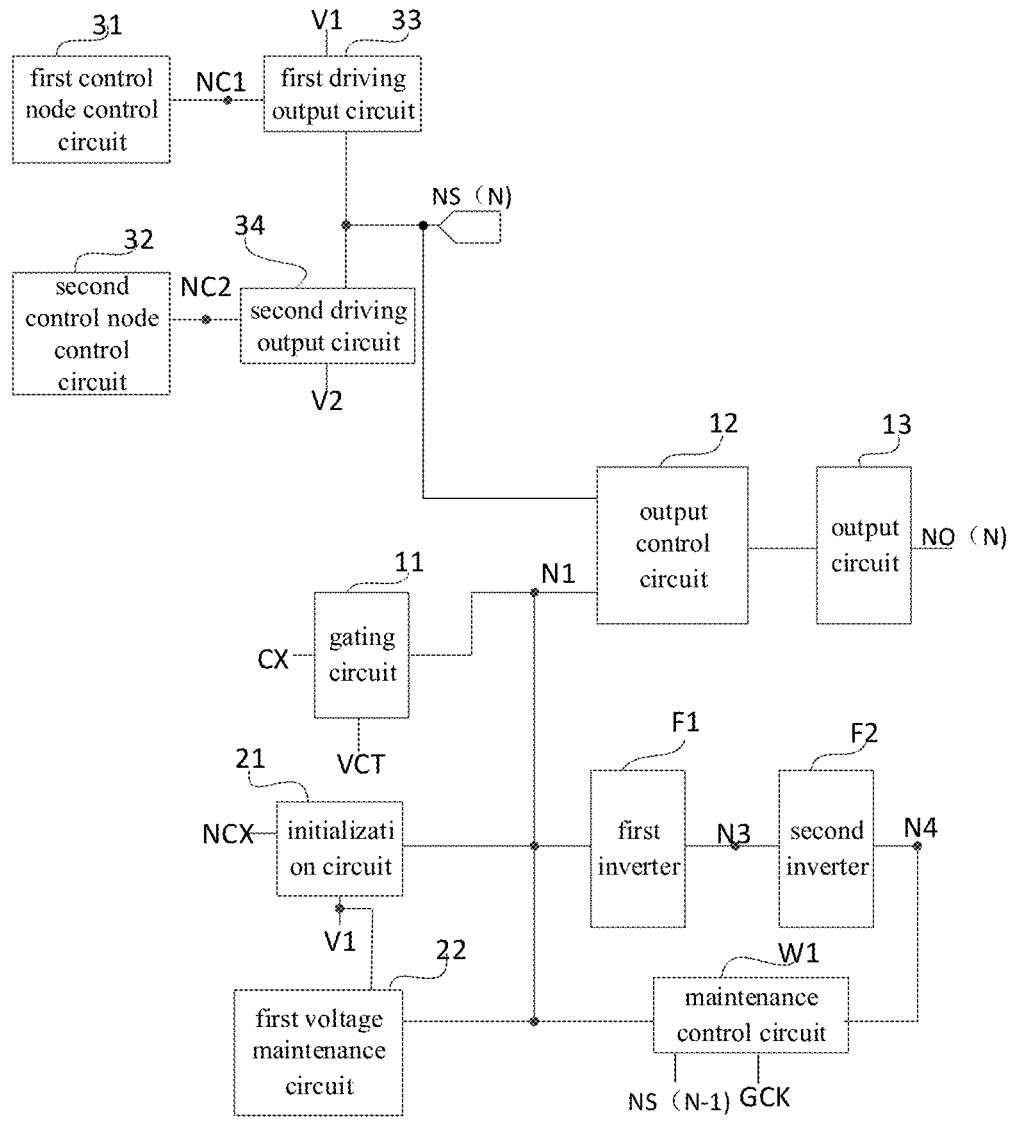
FIG. 20 is a structural diagram of a driving circuit according to at least one embodiment of the present disclosure.

As shown in FIG. 20, on the basis of at least one embodiment of the driving circuit shown in FIG. 18, the driving signal generation circuit may include a first control node control circuit 31, a second control node control circuit 32, a first driving output circuit 33 and a second driving output circuit 34;

The first control node control circuit 31 is electrically connected to the first control node NC1, is configured to control the potential of the first control node NC1;

The second control node control circuit 32 is electrically connected to the second control node NC2, is configured to control the potential of the second control node NC2;

The first driving output circuit 33 is electrically connected to the first control node NC1, the first voltage terminal V1, and the Nth stage of driving signal output terminal NS(N), and is configured to control to connect the Nth stage of driving signal output terminal NS(N) and the first voltage terminal V12 under the control of the potential of the first control node NC1;

The second driving output circuit 34 is electrically connected to the second control node NC2, the second voltage terminal V2, and the Nth stage of driving signal output terminal NS(N) respectively, and is configured to control to connect the Nth stage of driving signal output terminal NS(N) and the second voltage terminal V2 under the control of the potential of the second control node NC2.

Figure 21:
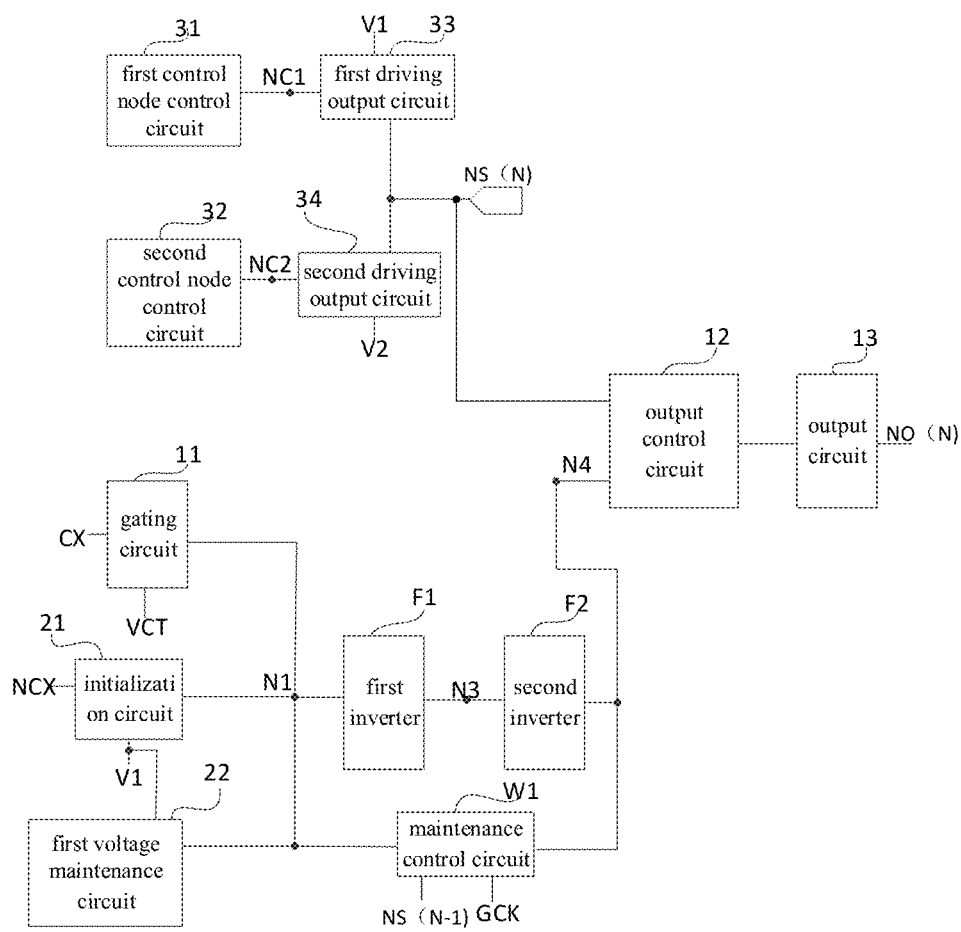
FIG. 21 is a structural diagram of a driving circuit according to at least one embodiment of the present disclosure.

As shown in FIG. 21, on the basis of at least one embodiment of the driving circuit shown in FIG. 19, the driving signal generation circuit may include a first control node control circuit 31, a second control node control circuit 32, a first driving output circuit 33 and a second driving output circuit 34;

The first control node control circuit 31 is electrically connected to the first control node NC1, is configured to control the potential of the first control node NC1;

The second control node control circuit 32 is electrically connected to the second control node NC2, is configured to control the potential of the second control node NC2;

The first driving output circuit 33 is electrically connected to the first control node NC1, the first voltage terminal V1, and the Nth stage of driving signal output terminal NS(N), and is configured to control to connect the Nth stage of driving signal output terminal NS(N) and the first voltage terminal V12 under the control of the potential of the first control node NC1;

The second driving output circuit 34 is electrically connected to the second control node NC2, the second voltage terminal V2, and the Nth stage of driving signal output terminal NS(N) respectively, and is configured to control to connect the Nth stage of driving signal output terminal NS(N) and the second voltage terminal V2 under the control of the potential of the second control node NC2.

In at least one embodiment of the present disclosure, the first control node control circuit includes a seventh node control circuit, an eighth node control circuit, and a first control circuit;

The seventh node control circuit is respectively electrically connected to the first clock signal terminal, the first voltage terminal, the seventh node and the ninth node, and is configured to control to connect the seventh node and the first voltage terminal under the control of the first clock signal provided by the first clock signal terminal, control to connect the seventh node and the first clock signal terminal under the control of the potential of the ninth node;

The eighth node control circuit is electrically connected to the second voltage terminal, the seventh node, and the eighth node, and is configured to control to connect the seventh node and the eighth node;

The first control circuit is electrically connected to the eighth node, the second node, the second clock signal terminal, the ninth node, the first voltage terminal and the first control node, and is configured to control to connect the second node and the second clock signal terminal under the control of the potential of the eighth node, control the potential of the second node according to the potential of the eighth node, and control to connect the second node and the first control node under the control of the second clock signal provided by the second clock signal terminal, and control to connect the first control node and the first voltage terminal under the control of the potential of the ninth node.

In specific implementation, the first control node control circuit may include a seventh node control circuit, an eighth node control circuit and a first control circuit, the seventh node control circuit controls the potential of the seventh node, and the eighth node control circuit controls the potential of the eighth node, the first control circuit controls the potential of the first control node.

In at least one embodiment of the present disclosure, the second control node control circuit includes a ninth node control circuit, a tenth node control circuit, an eleventh node control circuit, and a second control circuit;

The ninth node control circuit is electrically connected to the first clock signal terminal, the (N−1)th stage of driving signal output terminal, the initial control terminal, the first voltage terminal and the ninth node, control to connect the (N−1)th stage of driving signal output terminal and the ninth node under the control of the first clock signal provided by the clock signal terminal, and control to connect the ninth node and the first voltage terminal under the control of the initial control signal provided by the initial control terminal;

The tenth node control circuit is electrically connected to the first clock signal terminal, the (N−1)th stage of driving signal output terminal and the tenth node, and is configured to control to connect the (N−1)th stage of driving signal output terminal and the tenth node under the control of the first clock signal;

The eleventh node control circuit is respectively electrically connected to the second voltage terminal, the tenth node, the eleventh node, the seventh node, the first voltage terminal, the twelfth node and the second clock signal terminal, is configured to control to connect the tenth node and the eleventh node under the control of the second voltage signal provided by the second voltage terminal, and control to connect the twelfth node and the first voltage terminal under the control of the potential of the seventh node, and control to connect the twelfth node and the second clock signal terminal under the control of the potential of the eleventh node, and control the potential of the eleventh node according to the potential of the twelfth node;

The second control circuit is electrically connected to the second control node, the eleventh node, the second voltage terminal and the ninth node, and is configured to control the potential of the second control node under the control of the potential of the eleventh node, and control to connect the ninth node and the second control node under the control of the second voltage signal provided by the second voltage terminal.

In specific implementation, the second control node control circuit may include a ninth node control circuit, a tenth node control circuit, an eleventh node control circuit, and a second control circuit, and the ninth node control circuit controls the potential of the ninth node, the tenth node control circuit controls the potential of the tenth node, the eleventh node control circuit controls the potential of the tenth node, and the second control circuit controls the potential of the second control node.

Figure 22:
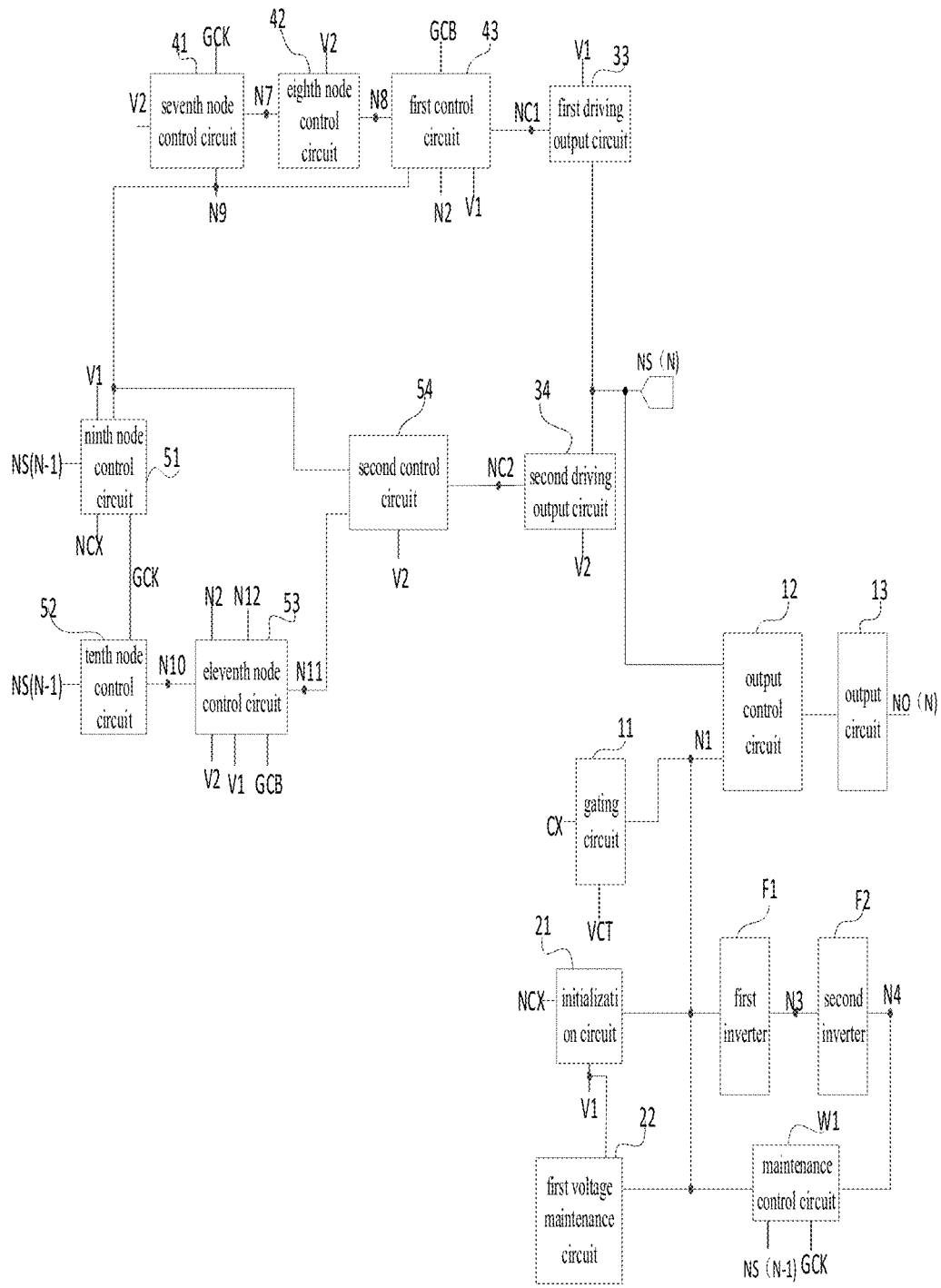
FIG. 22 is a structural diagram of a driving circuit according to at least one embodiment of the present disclosure.

As shown in FIG. 22, on the basis of at least one embodiment of the driving circuit shown in FIG. 20, the first control node control circuit includes a seventh node control circuit 41, an eighth node control circuit 42 and a first control circuit 43;

The seventh node control circuit 41 is electrically connected to the first clock signal terminal GCK, the second voltage terminal V2, the seventh node N7 and the ninth node N9 respectively, and is configured to control to connect the seventh node N7 and the second voltage terminal V2 under the control of the first clock signal provided by the first clock signal terminal GCK, control to connect the seventh node N7 and the first clock signal terminal GCK under the control of the potential of the ninth node N9;

The eighth node control circuit 42 is respectively electrically connected to the second voltage terminal V2, the seventh node N7 and the eighth node N8, and is configured to control to connect the seventh node N7 and the eighth node N8 under the control of the second voltage signal provided by the second voltage terminal V2;

The first control circuit 43 is electrically connected to the eighth node N8, the second node N2, the second clock signal terminal GCB, the ninth node N9, the first voltage terminal V1 and the first control node NC1 respectively, is configured to control to connect the second node N2 and the second clock signal terminal GCB under the control of the potential of the eighth node N8, control the potential of the second node N2 according to the potential of the eighth node N8, control to connect the second node N2 and the first control node NC1 under the control of the second clock signal provided by the second clock signal terminal GCB, and control to connect the first control node NCT and the first voltage terminal V1 under the control of the potential of the ninth node N9;

The second control node control circuit includes a ninth node control circuit 51, a tenth node control circuit 52, an eleventh node control circuit 53 and a second control circuit 54;

The ninth node control circuit 51 is respectively connected to the first clock signal terminal GCK, the (N−1)th stage of driving signal output terminal NS (N−1), the initial control terminal NCX, the first voltage terminal V1 and the ninth node N9, is configured to control to connect the (N−1)th stage of driving signal output terminal NS(N−1) and the ninth node N9 under the control of the first clock signal provided by the first clock signal terminal GCK, and control to connect the ninth node N9 and the first voltage terminal V1 under the control of the initial control signal provided by the initial control terminal NX;

The tenth node control circuit 52 is electrically connected to the first clock signal terminal GCK, the (N−1)th stage of driving signal output terminal NS(N−1) and the tenth node N10 respectively, and is configured to control to connect the (N−1)th stage of driving signal output terminal NS(N−1) and the tenth node N10 under the control of the first clock signal;

The eleventh node control circuit 53 is respectively connected to the second voltage terminal V2, the tenth node N10, the eleventh node N11, the seventh node N7, the first voltage terminal V1, the twelfth node N12 and the second clock signal terminal GCB, and is configured to control to connect the tenth node N10 and the eleventh node N11 under the control of the second voltage signal provided by the second voltage terminal V2, and control to connect the twelfth node N12 and the first voltage terminal V1 under the control of the potential of the seventh node N7, and control to connect the twelfth node N12 and the second clock signal terminal GCB under the control of the potential of the eleventh node N11, and control the potential of the eleventh node N11 according to the potential of the twelfth node N12;

The second control circuit 54 is electrically connected to the second control node NC2, the eleventh node N11, the second voltage terminal V2, and the ninth node N9, respectively, is configured to control the potential of the second control node NC2 under the control of the potential of the eleventh node N11, and control to connect the ninth node N9 and the second control node NC2 under the control of the second voltage signal provided by the second voltage terminal V2.

Figure 23:
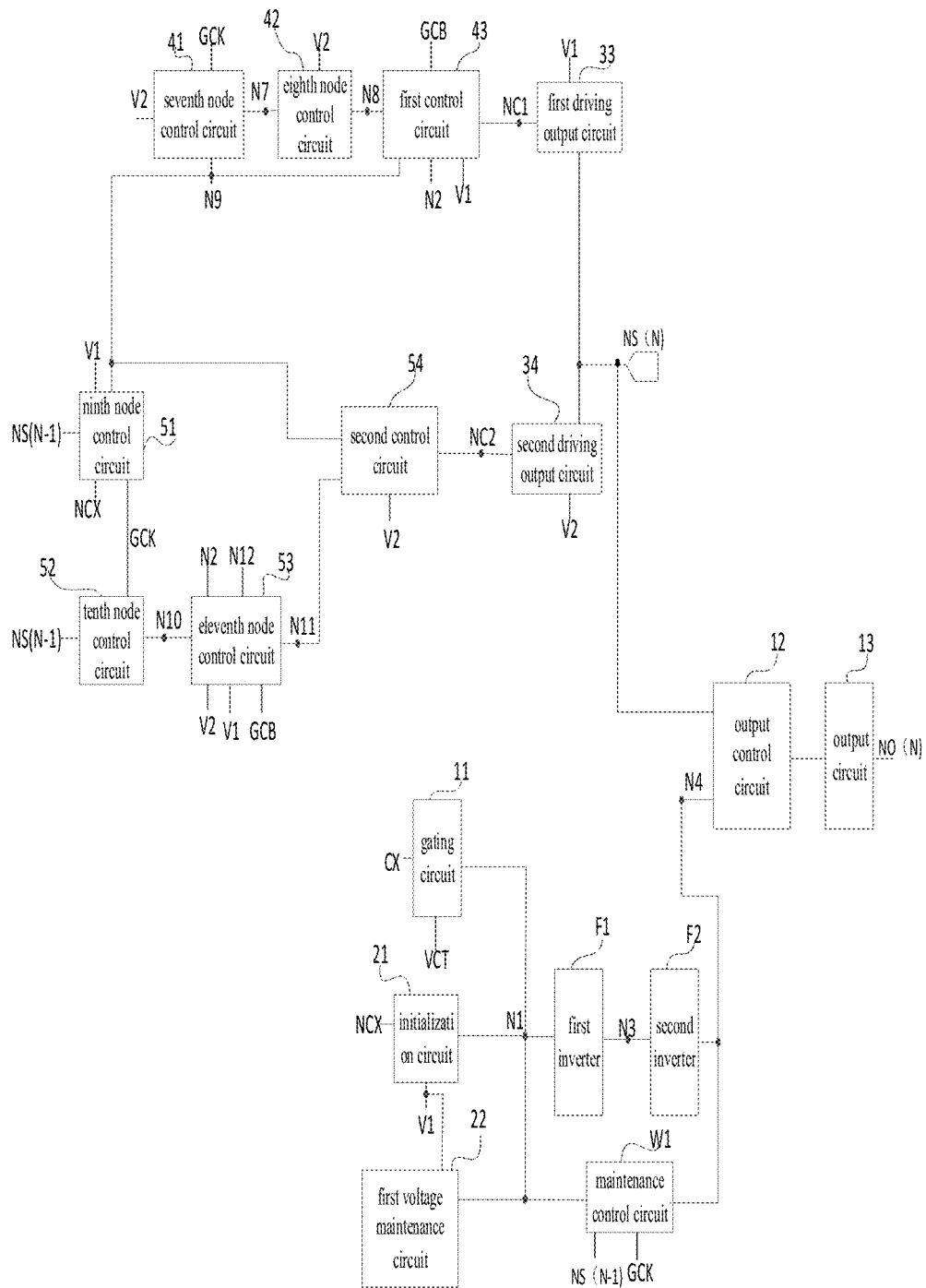
FIG. 23 is a structural diagram of a driving circuit according to at least one embodiment of the present disclosure.

As shown in FIG. 23, on the basis of at least one embodiment of the driving circuit shown in FIG. 21, the first control node control circuit includes a seventh node control circuit 41, an eighth node control circuit 42 and a first control circuit 43;

The seventh node control circuit 41 is electrically connected to the first clock signal terminal GCK, the second voltage terminal V2, the seventh node N7 and the ninth node N9 respectively, and is configured to control to connect the seventh node N7 and the second voltage terminal V2 under the control of the first clock signal provided by the first clock signal terminal GCK, and control to connect the seventh node N7 and the first clock signal terminal GCK under the control of the potential of the ninth node N9;

The eighth node control circuit 42 is respectively electrically connected to the second voltage terminal V2, the seventh node N7 and the eighth node N8, and is configured to control to connect the seventh node N7 and the eighth node N8 under the control of the second voltage signal provided by the second voltage terminal V2;

The first control circuit 43 is electrically connected to the eighth node N8, the second node N2, the second clock signal terminal GCB, the ninth node N9, the first voltage terminal V1 and the first control node NC1 respectively, is configured to control to connect the second node N2 and the second clock signal terminal GCB under the control of the potential of the eighth node N8, control the potential of the second node N2 according to the potential of the eighth node N8, control to connect the second node N2 and the first control node NC1 under the control of the second clock signal provided by the second clock signal terminal GCB, and control to connect the first control node NCT and the first voltage terminal V1 under the control of the potential of the ninth node N9;

The second control node control circuit includes a ninth node control circuit 51, a tenth node control circuit 52, an eleventh node control circuit 53 and a second control circuit 54;

The ninth node control circuit 51 is respectively connected to the first clock signal terminal GCK, the (N−1)th stage of driving signal output terminal NS (N−1), the initial control terminal NCX, the first voltage terminal V1 and the ninth node N9, is configured to control to connect the (N−1)th stage of driving signal output terminal NS(N−1) and the ninth node N9 under the control of the first clock signal provided by the first clock signal terminal GCK, control to connect the ninth node N9 and the first voltage terminal V1 under the control of the initial control signal provided by the initial control terminal NX;

The tenth node control circuit 52 is electrically connected to the first clock signal terminal GCK, the (N−1)th stage of driving signal output terminal NS(N−1) and the tenth node N10 respectively, and is configured to control to connect the (N−1)th stage of driving signal output terminal NS(N−1) and the tenth node N10 under the control of the first clock signal;

The eleventh node control circuit 53 is respectively connected to the second voltage terminal V2, the tenth node N10, the eleventh node N11, the seventh node N7, the first voltage terminal V1, the twelfth node N12 and the second clock signal terminal GCB, and is configured to control to connect the tenth node N10 and the eleventh node N11 under the control of the second voltage signal provided by the second voltage terminal V2, control to connect the twelfth node N12 and the first voltage terminal V1 under the control of the potential of the seventh node N7, and control to connect the twelfth node N12 and the second clock signal terminal GCB under the control of the potential of the eleventh node N11, and control the potential of the eleventh node N11 according to the potential of the twelfth node N12;

The second control circuit 54 is electrically connected to the second control node NC2, the eleventh node N11, the second voltage terminal V2, and the ninth node N9, respectively, is configured to control the potential of the second control node NC2 according to the potential of the eleventh node N11, and control to connect the ninth node N9 and the second control node NC2 under the control of the second voltage signal provided by the second voltage terminal V2.

Optionally, the first driving output circuit includes a sixteenth transistor and a second capacitor;

A gate electrode of the sixteenth transistor is electrically connected to the first control node, a first electrode of the sixteenth transistor is electrically connected to the first voltage terminal, and a second electrode of the sixteenth transistor is electrically connected to the Nth stage of driving signal output terminal;

A first terminal of the second capacitor is electrically connected to the first control node, and a second terminal of the second capacitor is electrically connected to the first voltage terminal;

The second driving output circuit includes a seventeenth transistor and a third capacitor;

A gate electrode of the seventeenth transistor is electrically connected to the second control node, a first electrode of the seventeenth transistor is electrically connected to the Nth stage of driving signal output terminal, and the second electrode of the seventeenth transistor is electrically connected to the second voltage terminal;

A first terminal of the third capacitor is electrically connected to the Nth stage of driving signal output terminal, and a second terminal of the third capacitor is electrically connected to a second voltage terminal.

Optionally, the seventh node control circuit includes an eighteenth transistor and a nineteenth transistor;

A gate electrode of the eighteenth transistor is electrically connected to the first clock signal terminal, a first electrode of the eighteenth transistor is electrically connected to the second voltage terminal, and a second electrode of the eighteenth transistor is electrically connected to the seventh node;

A gate electrode of the nineteenth transistor is electrically connected to the ninth node, a first electrode of the nineteenth transistor is electrically connected to the seventh node, and a second electrode of the nineteenth transistor is electrically connected to the first clock signal terminal;

The eighth node control circuit includes a twentieth transistor;

A gate electrode of the twentieth transistor is electrically connected to the second voltage terminal, a first electrode of the twentieth transistor is electrically connected to the seventh node, and a second electrode of the twentieth transistor is electrically connected to the eighth node;

The first control circuit includes a twenty-first transistor, a fourth capacitor, a twenty-second transistor, and a twenty-third transistor;

A gate electrode of the twenty-first transistor is electrically connected to the eighth node, a first electrode of the twenty-first transistor is electrically connected to the second clock signal terminal, and a second electrode of the twenty-first transistor electrically connected to the second node;

A first terminal of the fourth capacitor is electrically connected to the eighth node, and a second terminal of the fourth capacitor is electrically connected to the second node;

A gate electrode of the twenty-second transistor is electrically connected to the second clock signal terminal, a first electrode of the twenty-second transistor is electrically connected to the second node, and a second electrode of the twenty-second transistor electrically connected to the first control node;

A gate electrode of the twenty-third transistor is electrically connected to the ninth node, a first electrode of the twenty-third transistor is electrically connected to the first control node, and a second electrode of the twenty-third transistor is electrically connected to the first voltage terminal.

Optionally, the ninth node control circuit includes a twenty-fourth transistor and a twenty-fifth transistor;

A gate electrode of the twenty-fourth transistor is electrically connected to the first clock signal terminal, a first electrode of the twenty-fourth transistor is electrically connected to the (N−1)th stage of driving signal output terminal, and the second electrode of the twenty-fourth transistor is electrically connected to the ninth node;

A gate electrode of the twenty-fifth transistor is electrically connected to the initial control terminal, a first electrode of the twenty-fifth transistor is electrically connected to the first voltage terminal, and a second electrode of the twenty-fifth transistor is electrically connected to the ninth node;

The tenth node control circuit includes a twenty-sixth transistor;

A gate electrode of the twenty-sixth transistor is electrically connected to the first clock signal terminal, a first electrode of the twenty-sixth transistor is electrically connected to the (N−1)th stage of driving signal output terminal, and a second electrode of the twenty-sixth is electrically connected to the tenth node;

The eleventh node control circuit includes a twenty-seventh transistor, a twenty-eighth transistor, a twenty-ninth transistor and a fifth capacitor;

A gate electrode of the twenty-seventh transistor is electrically connected to the second voltage terminal, a first electrode of the twenty-seventh transistor is electrically connected to the tenth node, and a second electrode of the twenty-seventh transistor is electrically connected to the eleventh node;

A gate electrode of the twenty-eighth transistor is electrically connected to the seventh node, a first electrode of the twenty-eighth transistor is electrically connected to the first voltage terminal, and a second electrode of the twenty-eighth transistor is electrically connected to the twelfth node;

A gate electrode of the twenty-ninth transistor is electrically connected to the eleventh node, a first electrode of the twenty-ninth transistor is electrically connected to the twelfth node, and a second electrode of the twenty-ninth transistor is electrically connected to the second clock signal terminal;

A first terminal of the fifth capacitor is electrically connected to the twelfth node, and a second terminal of the fifth capacitor is electrically connected to the eleventh node;

The second control circuit includes a thirtieth transistor and a thirty-first transistor;

Both a gate electrode of the thirtieth transistor and a first electrode of the thirtieth transistor are electrically connected to the eleventh node, and a second electrode of the thirtieth transistor is electrically connected to the second control node;

A gate electrode of the thirty-first transistor is electrically connected to the second voltage terminal, a first electrode of the thirty-first transistor is electrically connected to the ninth node, and a second electrode of the thirty-first transistor is electrically connected to the second control node.

Figure 24:
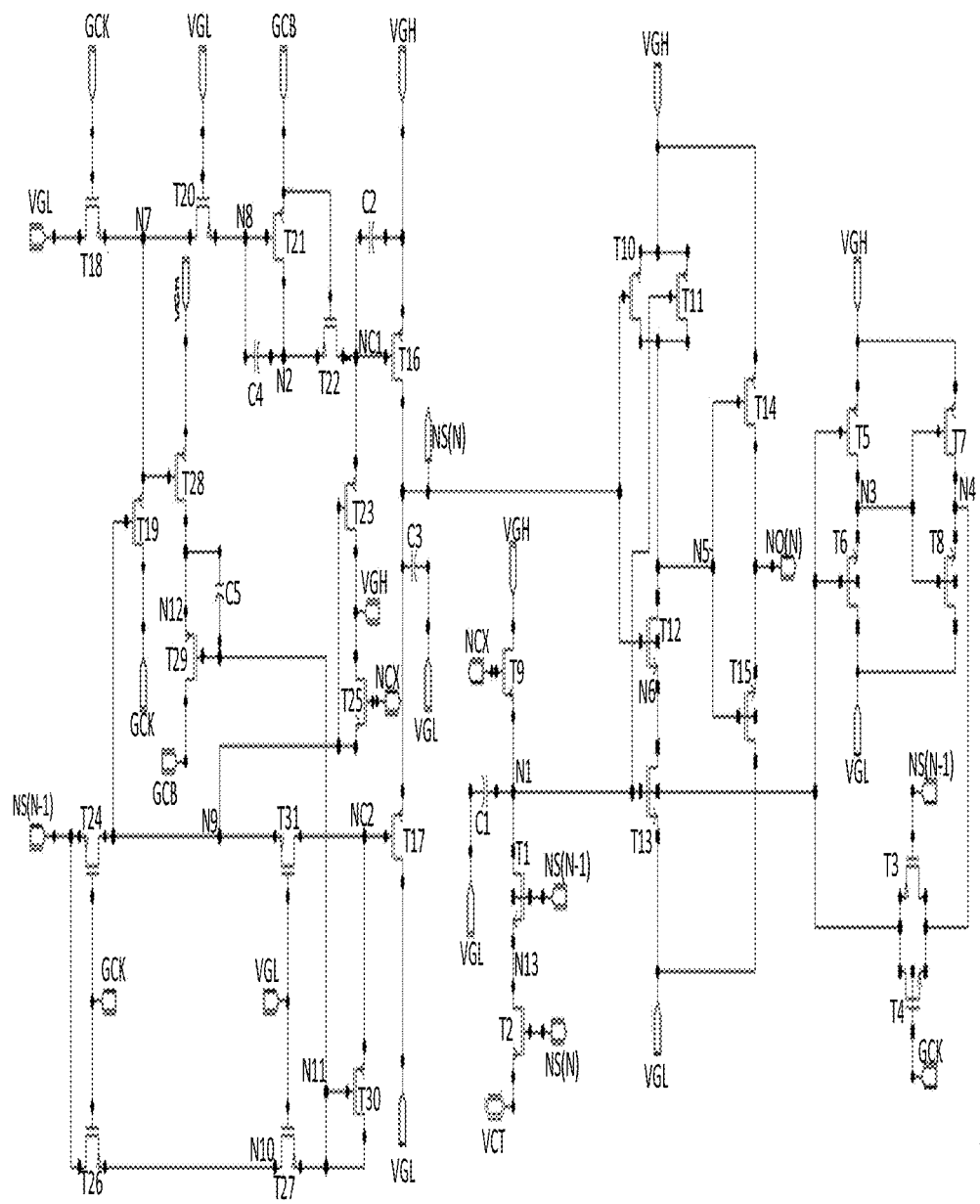
FIG. 24 is a circuit diagram of a driving circuit according to at least one embodiment of the present disclosure.

As shown in FIG. 24, on the basis of at least one embodiment of the driving circuit shown in FIG. 22, The gating circuit includes a first transistor T1 and a second transistor T2;

The gate electrode of the first transistor T1 is electrically connected to the (N−1)th stage of driving signal output terminal NS(N−1), the source electrode of the first transistor T1 is electrically connected to the first node N1, and the drain electrode of the first transistor T1 is electrically connected to the drain electrode of the second transistor T2;

The gate electrode of the second transistor T2 is electrically connected to the Nth stage of driving signal output terminal NS(N), and the source electrode of the second transistor T2 is electrically connected to the gating input terminal VCT;

The maintenance control circuit includes a third transistor T3 and a fourth transistor T4;

The gate electrode of the third transistor T3 is electrically connected to the (N−1)th stage of driving signal output terminal NS(N−1), the source electrode of the third transistor T3 is electrically connected to the first node N1, and the drain electrode of the third transistor T3 is electrically connected to the fourth node N4;

The gate electrode of the fourth transistor T4 is electrically connected to the first clock signal terminal GCK, the source electrode of the fourth transistor T4 is electrically connected to the fourth node N4, and the drain electrode of the fourth transistor T4 is electrically connected to the first node N1;

The first inverter includes a fifth transistor T5 and a sixth transistor T6, and the second inverter includes a seventh transistor T7 and an eighth transistor T8;

The gate electrode of the fifth transistor T5 is electrically connected to the first node N1, the source electrode of the fifth transistor T5 is electrically connected to the high voltage terminal VGH, and the drain electrode of the fifth transistor T5 is electrically connected to the third node N3;

The gate electrode of the sixth transistor T6 is electrically connected to the first node N1, the source electrode of the sixth transistor T6 is electrically connected to the third node N3, and the drain electrode of the sixth transistor T6 is connected to the low voltage terminal VGL;

The gate electrode of the seventh transistor T7 is electrically connected to the third node N3, the source electrode of the seventh transistor T7 is electrically connected to the high voltage terminal VGH, and the drain electrode of the seventh transistor T7 is electrically connected to the fourth node N4;

The gate electrode of the eighth transistor T8 is electrically connected to the third node N3, the source electrode of the eighth transistor T8 is electrically connected to the fourth node N4, and the drain electrode of the eighth transistor T8 is connected to the low voltage Terminal VGL;

The initialization circuit includes a ninth transistor T9, and the first voltage maintenance circuit includes a first capacitor C1;

The gate electrode of the ninth transistor T9 is electrically connected to the initial control terminal NCX, the source electrode of the ninth transistor T9 is electrically connected to the high voltage terminal VGH, and the drain electrode of the ninth transistor T9 is electrically connected to the first node N1;

The first terminal of the first capacitor C1 is electrically connected to the first node N1, and the second terminal of the first capacitor C1 is electrically connected to the low voltage terminal VGL;

The output control circuit includes a tenth transistor T10, an eleventh transistor T11, a twelfth transistor T12 and a thirteenth transistor T13;

The gate electrode of the tenth transistor T10 is electrically connected to the Nth stage of driving signal output terminal NS(N), the source electrode of the tenth transistor T10 is electrically connected to the high voltage terminal VGH, and the drain electrode of the tenth transistor T10 is electrically connected to the fifth node N5;

The gate electrode of the eleventh transistor T11 is electrically connected to the first node N1, the source electrode of the eleventh transistor T11 is electrically connected to the high voltage terminal VGH, and the drain electrode of the eleventh transistor T11 is electrically connected to the fifth node N5;

The gate electrode of the twelfth transistor T12 is electrically connected to the Nth stage of driving signal output terminal NS(N), the source electrode of the twelfth transistor T12 is electrically connected to the fifth node N5, and the drain electrode of the twelfth transistor T12 is electrically connected to the sixth node N6;

The gate electrode of the thirteenth transistor T13 is electrically connected to the first node N1, the source electrode of the thirteenth transistor T13 is electrically connected to the sixth node N6, and the drain electrode of the thirteenth transistor T13 is electrically connected to the low voltage terminal VGL;

The output circuit includes a fourteenth transistor T14 and a fifteenth transistor T15;

The gate electrode of the fourteenth transistor T14 is electrically connected to the fifth node N5, the source electrode of the fourteenth transistor T14 is electrically connected to the high voltage terminal VGH, and the drain electrode of the fourteenth transistor T14 is electrically connected to the output driving terminal NO (N);

The gate electrode of the fifteenth transistor T15 is electrically connected to the fifth node N5, the source electrode of the fifteenth transistor T15 is electrically connected to the output driving terminal NO(N), and the drain electrode of the fifteenth transistor T15 is electrically connected to the low voltage terminal VGL;

The first driving output circuit includes a sixteenth transistor T16 and a second capacitor C2;

The gate electrode of the sixteenth transistor T16 is electrically connected to the first control node NC1, the source electrode of the sixteenth transistor T16 is electrically connected to the high voltage terminal VGH, and the drain electrode of the sixteenth transistor T16 is electrically connected to the Nth stage of driving signal output terminal NS(N);

A first terminal of the second capacitor C2 is electrically connected to the first control node NC1, and a second terminal of the second capacitor C2 is electrically connected to the high voltage terminal VGH;

The second driving output circuit includes a seventeenth transistor T17 and a third capacitor C3;

The gate electrode of the seventeenth transistor T17 is electrically connected to the second control node NC2, the source electrode of the seventeenth transistor T17 is electrically connected to the Nth stage of driving signal output terminal NS(N), and the drain electrode of the seventeenth transistor T17 is electrically connected to the low voltage terminal VGL;

The first terminal of the third capacitor C3 is electrically connected to the Nth stage of driving signal output terminal NS(N), and the second terminal of the third capacitor C3 is electrically connected to the low voltage terminal VGL;

The seventh node control circuit includes an eighteenth transistor T18 and a nineteenth transistor T19;

The gate electrode of the eighteenth transistor T18 is electrically connected to the first clock signal terminal GCK, the source electrode of the eighteenth transistor T18 is electrically connected to the low voltage terminal VGL, and the drain electrode of the eighteenth transistor T18 electrically connected to the seventh node N7;

The gate electrode of the nineteenth transistor T19 is electrically connected to the ninth node N9, the source electrode of the nineteenth transistor T19 is electrically connected to the seventh node N7, and the drain electrode of the nineteenth transistor T19 is electrically connected to the first clock signal terminal GCK;

The eighth node control circuit includes a twentieth transistor T20;

The gate electrode of the twentieth transistor T20 is electrically connected to the low voltage terminal VGL, the source electrode of the twentieth transistor T20 is electrically connected to the seventh node N7, and the drain electrode of the twentieth transistor T20 is electrically connected to the eighth node N8;

The first control circuit includes a twenty-first transistor T21, a fourth capacitor C4, a twenty-second transistor T22, and a twenty-third transistor T23;

The gate electrode of the twenty-first transistor T21 is electrically connected to the eighth node N8, the source electrode of the twenty-first transistor T21 is electrically connected to the second clock signal terminal GCB, and the drain electrode of the twenty-first transistor T21 is electrically connected to the second node N2;

A first terminal of the fourth capacitor C4 is electrically connected to the eighth node N8, and a second terminal of the fourth capacitor C4 is electrically connected to the second node N2;

The gate electrode of the twenty-second transistor T22 is electrically connected to the second clock signal terminal GCB, the source electrode of the twenty-second transistor T22 is electrically connected to the second node N2, and the drain electrode of the twenty-second transistor T22 is electrically connected to the first control node NC1;

The gate electrode of the twenty-third transistor T23 is electrically connected to the ninth node N9, the source electrode of the twenty-third transistor T23 is electrically connected to the first control node NC1, and the drain electrode of the twenty-third transistor T23 is electrically connected to the high voltage terminal VGH;

The ninth node control circuit includes a twenty-fourth transistor T24 and a twenty-fifth transistor T25;

The gate electrode of the twenty-fourth transistor T24 is electrically connected to the first clock signal terminal GCK, and the source electrode of the twenty-fourth transistor T24 is connected to the (N−1)th stage of driving signal output terminal NS (N−1), the drain electrode of the twenty-fourth transistor T24 is electrically connected to the ninth node N9;

The gate electrode of the twenty-fifth transistor T25 is electrically connected to the initial control terminal NCX, the source electrode of the twenty-fifth transistor T25 is electrically connected to the high voltage terminal VGH, and the drain electrode of the twenty-fifth transistor T25 is electrically connected to the ninth node N9;

The tenth node control circuit includes a twenty-sixth transistor T26;

The gate electrode of the twenty-sixth transistor T26 is electrically connected to the first clock signal terminal GCK, and the source electrode of the twenty-sixth transistor T26 is connected to the (N−1)th stage of driving signal output terminal NS (N−1), the drain electrode of the twenty-sixth transistor T26 is electrically connected to the tenth node N10;

The eleventh node control circuit includes a twenty-seventh transistor T27, a twenty-eighth transistor T28, a twenty-ninth transistor T29, and a fifth capacitor C5;

The gate electrode of the twenty-seventh transistor T27 is electrically connected to the low voltage terminal VGL, the source electrode of the twenty-seventh transistor T27 is electrically connected to the tenth node N10, and the drain electrode of the twenty-seventh transistor T27 is electrically connected to the eleventh node N11;

The gate electrode of the twenty-eighth transistor T28 is electrically connected to the seventh node N7, the source electrode of the twenty-eighth transistor T28 is electrically connected to the high voltage terminal VGH, and the drain electrode of the twenty-eighth transistor T28 is electrically connected to the twelfth node N12;

The gate electrode of the twenty-ninth transistor T29 is electrically connected to the eleventh node N11, the source electrode of the twenty-ninth transistor T29 is electrically connected to the twelfth node N12, and the drain electrode of the twenty-ninth transistor T29 is electrically connected to the second clock signal terminal GCB;

The first terminal of the fifth capacitor C5 is electrically connected to the twelfth node N12, and the second terminal of the fifth capacitor C5 is electrically connected to the eleventh node N11;

The second control circuit includes a thirtieth transistor and a thirty-first transistor;

Both the gate electrode of the thirtieth transistor T30 and the source electrode of the thirtieth transistor T31 are electrically connected to the eleventh node N11, and the drain electrode of the thirtieth transistor T31 is electrically connected to the second control node NC2;

The gate electrode of the thirty-first transistor T31 is electrically connected to the low voltage terminal VGL, the source electrode of the thirty-first transistor T31 is electrically connected to the ninth node N9, and the drain electrode of the thirty-first transistor T31 is electrically connected to the second control node NC2.

In FIG. 24, the one labeled N13 is the thirteenth node.

In at least one embodiment of the driving circuit shown in FIG. 24, T1 is an n-type transistor, T2 is a p-type transistor, T3 is a p-type transistor, T4 is an n-type transistor, T5 is a p-type transistor, T6 is an n-type transistor, T7 is a p-type transistor, T8 is an n-type transistor, T9 is a p-type transistor, T10 and T11 are n-type transistors, T12 and T13 are n-type transistors, T14 is a p-type transistor, T15 is an n-type transistor, T16-T31 are p-type transistors.

In at least one embodiment of the present disclosure, the structure of the driving signal generation circuit is not limited to that shown in FIG. 24, the driving signal generation circuit may be 16T3C circuit, 13T3C circuit, 12T3C circuit, 10T3C circuit, which is not limited.

When at least one embodiment of the driving circuit shown in FIG. 24 of the present disclosure is in operation, In the first phase, when NS (N−1) outputs a low voltage signal, GCK outputs a low voltage signal, and GCB provides a high voltage signal, T24 and T26 are turned on, the potential of N9 and the potential of N10 are low voltage, and T27 and T31 are turned on, to ensure that the potential of NC2 and the potential of N11 are low voltage, T17 is turned on, and NS (N) outputs a low voltage signal; the potential of N11 is low voltage to ensure that T29 is turned on, and the potential of N9 is low voltage to turn on T19, T18 is turned on to pull down the potential of N7 and the potential of N8, T21 is turned on, GCB writes a high voltage signal into N2, and the potential of N9 is low voltage, so as to turn on T23, pull up the potential of NC1 to high voltage, and ensure that T16 is turned off, In the second phase, NS (N−1) outputs a low voltage signal, the potential of the first clock signal output by GCK jumps from a low voltage to a high voltage, T24 and T26 are turned off, the potential of N9 is a low voltage, T19 is turned on, and T18 is turned off, T20 is turned on, the potential of N7 and the potential of N8 are high voltage, T21 is turned off, the potential of N2 is maintained at high voltage, GCB outputs a low voltage signal, T22 is turned on, the potential of NC1 is maintained at high voltage, and T16 is turned off, at the same time, the potential of N11 is maintained at a low voltage, T29 is turned on, GCB writes the low voltage signal into N12, and the potential of N11 is pulled down to a lower voltage (5V-10V lower than the voltage value of the low voltage signal provided by GCB) through C5, T30 is turned on, to write the low voltage signal into NC2 (the potential of NC2 is 3-8V lower than the voltage value of the low voltage signal provided by GCB), and T17 is fully turned on to ensure that NS (N) outputs a low voltage signal;

In the third phase, NS (N−1) outputs a high voltage signal, GCK outputs a low voltage signal, GCB outputs a high voltage signal, T24 and T26 are turned on, the potential of N9 and N10 are controlled to be high voltage, T27 and T31 are turned on, the potential of NC2 and the potential of N11 are high voltage, T17 is turned off; the potential of N11 is high voltage, T29 is turned off, the potential of N9 is high voltage, T19 is turned off, T18 is turned on, T20 is turned on, and the potential of N7 and the potential of N8 is pulled down, T21 is turned on, GCB writes a high voltage signal into N2, T22 is turned off, the potential of N9 is high voltage, and T23 is turned off, and the potential of NC1 is maintained at high voltage to ensure that T16 is turned off, In the fourth phase, NS (N−1) outputs a high voltage signal, the potential of the first clock signal output by GCK jumps from low voltage to high voltage, GCB outputs a low voltage signal, T24 and T26 are turned off, and the potential of N9 is high voltage, to turn off T19, T18 is turned on, T20 is turned on, to maintain the potential of N7 and the potential of N8 at low voltage, T21 is turned on, T22 is turned on, the potential of N2 and the potential of NCT are low voltage, T16 is turned on, NS (N) outputs a high voltage signal; at the same time, the potential of N11 is a high voltage, T29 is turned off, and the potential of N12 remains unchanged, ensuring that the potential of N11 is a high voltage;

In the fifth phase, the potential of the (N−1)th stage of driving signal output by NS (N−1) jumps from high voltage to low voltage, GCK outputs a high voltage signal, GCB outputs a low voltage signal, T24 and T26 are turned off, and the potential of N9 and the potential of N10 are maintained at a high voltage, and the potentials of the other nodes remain unchanged to ensure that NS (N) outputs a high voltage signal;

In the sixth phase, NS (N−1) outputs a low voltage signal, the potential of the first clock signal output by GCK jumps from high voltage to low voltage, GCB outputs a high voltage signal, T24 and T26 are turned on, the potential of N9 and the potential of N10 are low voltage, T27 and T31 are turned on, to ensure that the potential of NC2 and the potential of N11 are low voltage, T17 is turned on, NS (N) outputs a low voltage signal; the potential of N11 is low voltage, to ensure that T29 is turned on, and the potential of N9 is low voltage, to turn on T19, T18 is turned on, T20 is turned on, to pull down the potential of N7 and the potential of N8, T21 is turned on, GCB writes a high voltage signal into N2, the potential of N9 is low voltage, to turn on T23, pull up the potential of NC1 to high voltage, ensure that T16 is turned off.

Optionally, when the display starts (that is, when the display device is powered on), in the power-on phase before the first phase, NCX outputs a low voltage signal, T9 is turned on, to control the potential of N1 to be a high voltage, T25 is turned on, and the potential of N9 is high voltage, T19 is turned off, when GCK provides a low voltage signal, the potential of N7 is low voltage, T20 is turned on, the potential of N8 is low voltage, and T21 is turned on to control to connect N2 and GCB; when GCB provides low voltage signal, T22 is turned on, the potential of NC1 is low voltage, T16 is turned on, NS (N) outputs a high voltage signal; T12 is turned on, T13 is turned on, the potential of N5 is low voltage, T14 is turned on, and NO (N) outputs a high voltage signal, the second display control transistor M2 included in all the pixel circuits in the effective display area can be turned on, and the residual charge in the storage capacitor Cst can be cleared, so as to improve the screen flickering failure;

Afterwards, when NS(N−1) outputs a high voltage signal and NS(N) outputs a low voltage signal, T1 and T2 are turned on, When VCT provides a low voltage signal, the potential of N1 is a low voltage signal, and C1 maintains the potential of N1; T11 is turned on, T10 is turned on, the potential of N5 is high voltage, T15 is turned on, and NO (N) outputs a low voltage signal;

When VCT provides a high voltage signal, the potential of N1 is a high voltage signal, C1 maintains the potential of N1, T11 is turned off, T10 is turned on, the potential of N5 is high voltage, T15 is turned on, and NO (N) outputs a low voltage signal;

Afterwards, in the supply phase of the Nth stage of driving signal, NS(N) outputs a high voltage signal, When the potential of N1 is low voltage, T10 is turned off, T11 is turned on, the potential of N5 is high voltage, T15 is turned on, and NO (N) outputs a low voltage signal;

When the potential of N1 is high voltage, T10 is turned off, T11 is turned off, T12 and T13 are turned on, the potential of N5 is low voltage, T14 is turned on, and NO (N) outputs a high voltage signal;

After the supply phase of the Nth stage of driving signal, NS(N) outputs a low voltage signal, When the potential of N1 is a low voltage signal, T10 is turned on, T11 is turned on, the potential of N5 is a high voltage, and NO (N) outputs a low voltage signal;

When the potential of N1 is a high voltage signal, T10 is turned on, T11 is turned off, the potential of N5 is a high voltage, and NO (N) outputs a low voltage signal.

When at least one embodiment of the driving circuit shown in FIG. 24 of the present disclosure is working, when NS(N−1) outputs a high voltage signal and NS(N) outputs a low voltage signal, T1 and T2 are turned on, and the above two signals are simultaneously connected, the state of the gating input signal within a high and low frequency switching period can be obtained.

In at least one embodiment of the driving circuit shown in FIG. 24 of the present disclosure, since the p-type transistor has a threshold voltage loss when delivering a low voltage, and the n-type transistor has a threshold voltage loss when delivering a high voltage, the absolute value of the potential of N1 will be lower, the absolute value of the potential of N1 can be controlled by the first inverter and the second inverter to increase, so that the corresponding transistors in the output circuit can be better controlled to be turned on or off, and when T1 and T2 are turned on, the maintenance control circuit can control to disconnect N1 and N4, so as not to affect the writing of the potential of N1.

Figure 25:
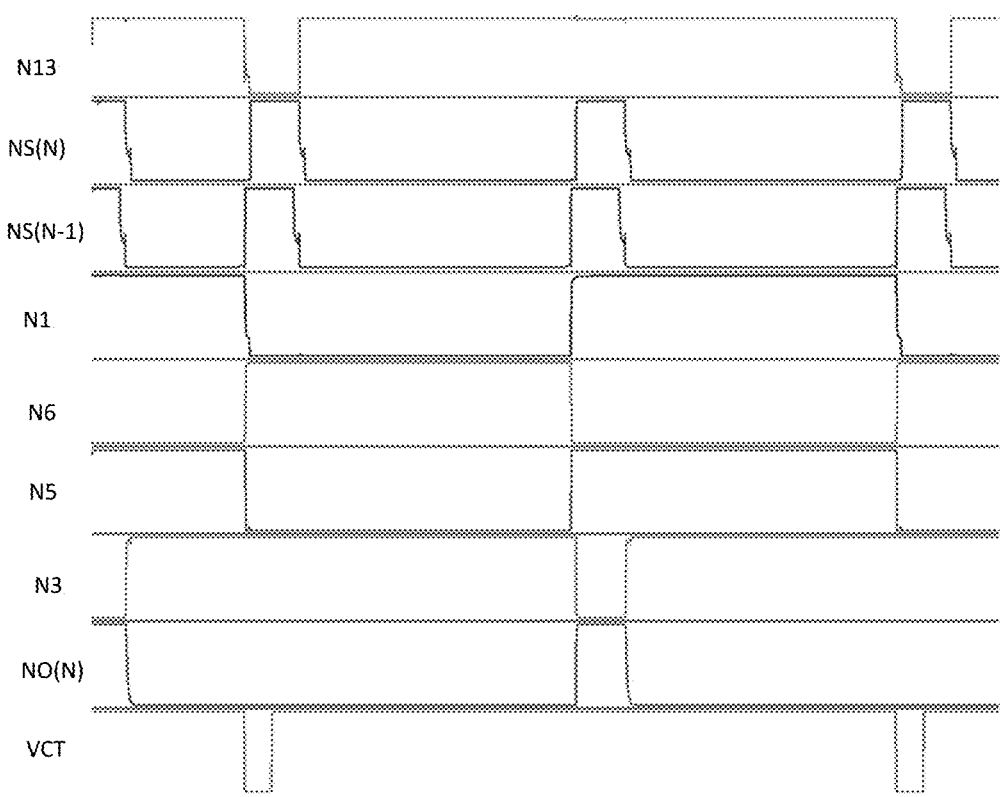
FIG. 25 is a working timing diagram of the driving circuit shown in FIG. 24.
Figure 26:
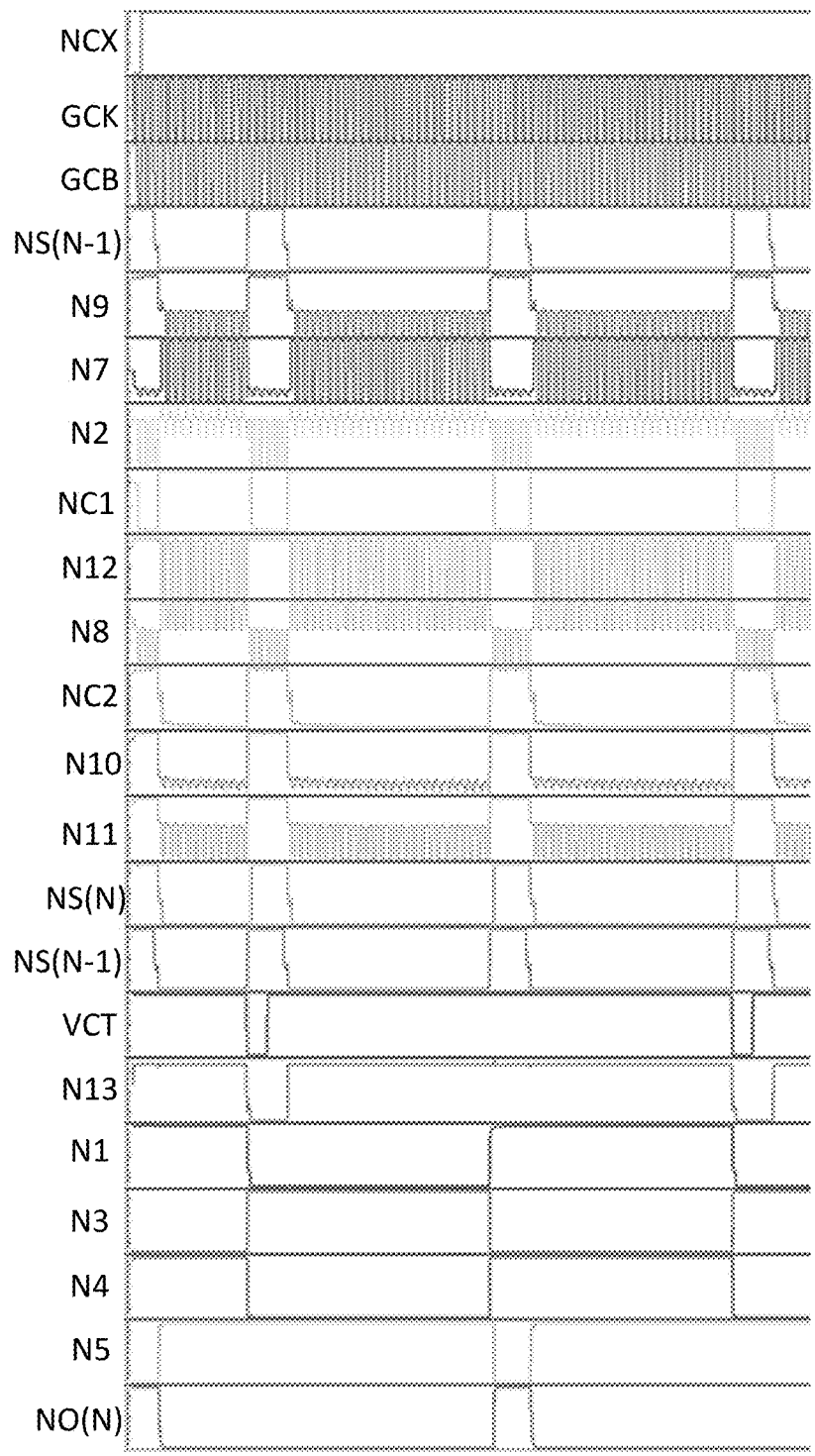
FIG. 26 is a simulation timing diagram of the driving circuit shown in FIG. 24.

FIG. 25 is a working timing diagram of the driving circuit shown in FIG. 24;

FIG. 26 is a simulation timing diagram of the driving circuit shown in FIG. 24.

Figure 27:
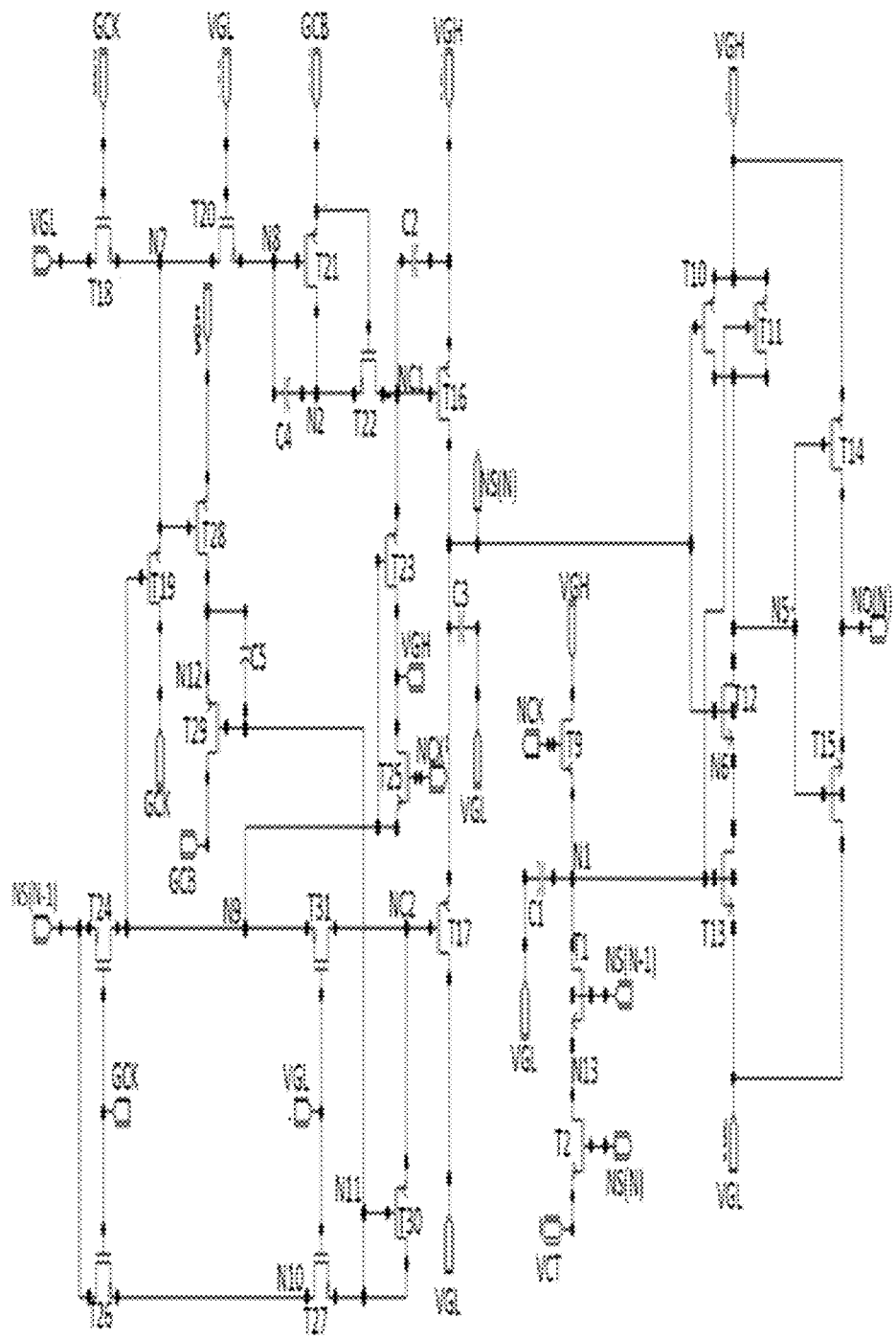
FIG. 27 is a structural diagram of a driving circuit according to at least one embodiment of the present disclosure.

The difference between at least one embodiment of the driving circuit shown in FIG. 27 of the present disclosure and at least one embodiment of the driving circuit shown in FIG. 24 of the present disclosure is as follows: the second voltage maintenance circuit is not provided (that is, T3-T8 is not provided).

The difference between at least one embodiment of the driving circuit shown in FIG. 28 of the present disclosure and at least one embodiment of the driving circuit shown in FIG. 24 of the present disclosure is as follows: N4 is electrically connected to the gate electrode of T11 and the gate electrode of T13.

Figure 28:
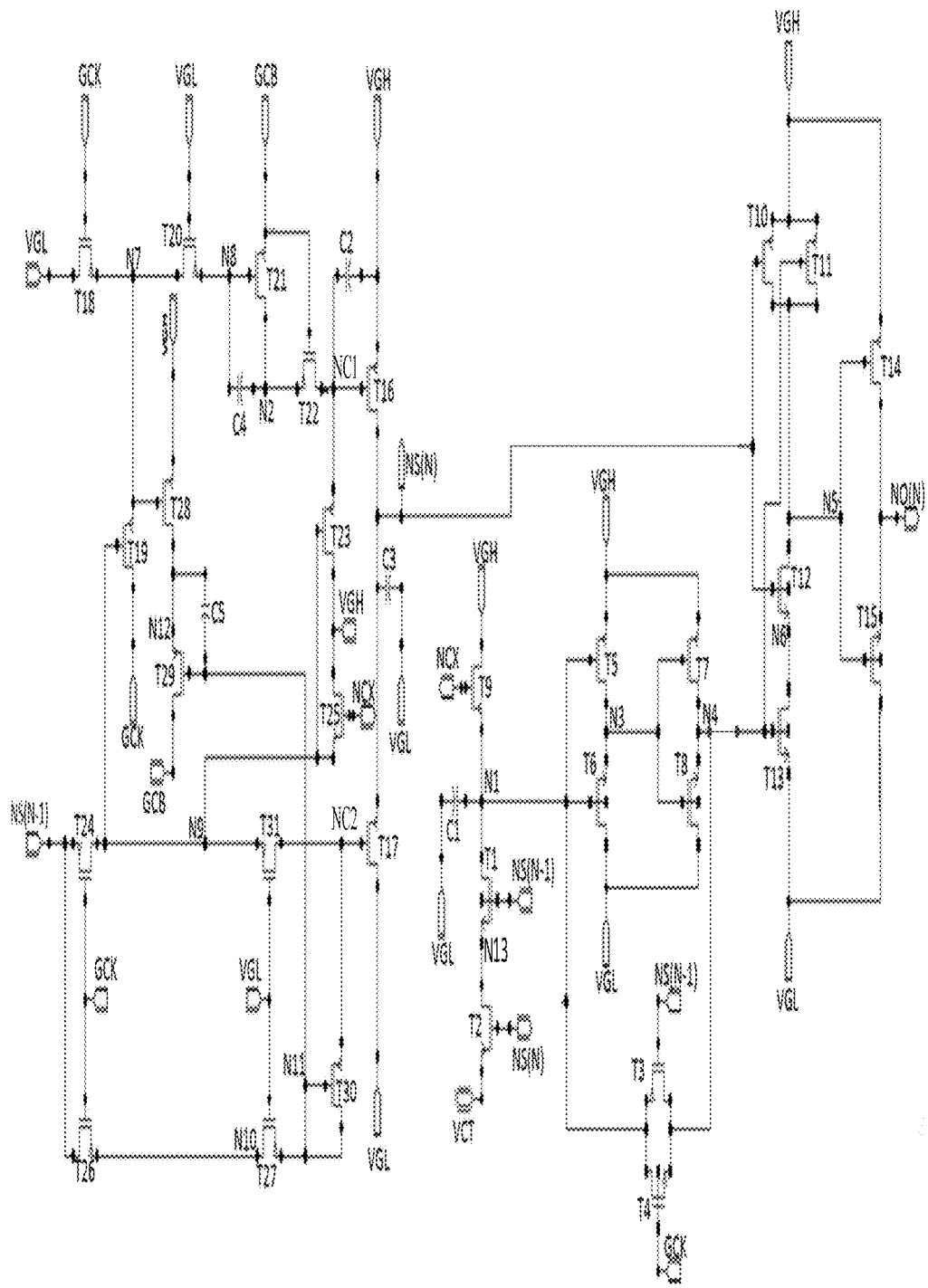
FIG. 28 is a structural diagram of a driving circuit according to at least one embodiment of the present disclosure.

During operation of at least one embodiment of the driving circuit shown in FIG. 28 of the present disclosure, since the p-type transistor has a threshold voltage loss when delivering a low voltage, and the n-type transistor has a threshold voltage loss when delivering a high voltage, the absolute value of the potential of N1 will be lower, then the absolute value of the potential of N4 can be controlled by the first inverter and the second inverter to increase, so that the corresponding transistor in the output circuit can be better controlled to turn on or off, and the maintenance control circuit controls to disconnect N1 and N4 when T1 and T2 are turned on, so as not to affect the writing of the potential of N1.

The driving method described in the embodiment of the present disclosure applies to the above-mentioned driving circuit, and the driving method includes:

Generating and outputting, by the driving signal generation circuit, the Nth stage of driving signal through the Nth stage of driving signal output terminal;

Controlling, by the gating circuit, the gating input signal provided by the gating input terminal to be written into the first node under the control of the gating control signal provided by the gating control terminal;

Performing, by the output control circuit, a NAND operation on the Nth stage of driving signal and the potential of the second terminal of the output control circuit to obtain the first output signal;

Inverting, by the output circuit, the first output signal to obtain and provide an output driving signal through the output driving terminal;

N is a positive integer.

The driving module described in the embodiment of the present disclosure includes a plurality of stages of the above-mentioned driving circuits;

An Nth stage driving circuit is electrically connected to a driving signal output terminal of an (N−1)th stage of driving circuit; N is a positive integer.

Figure 29:
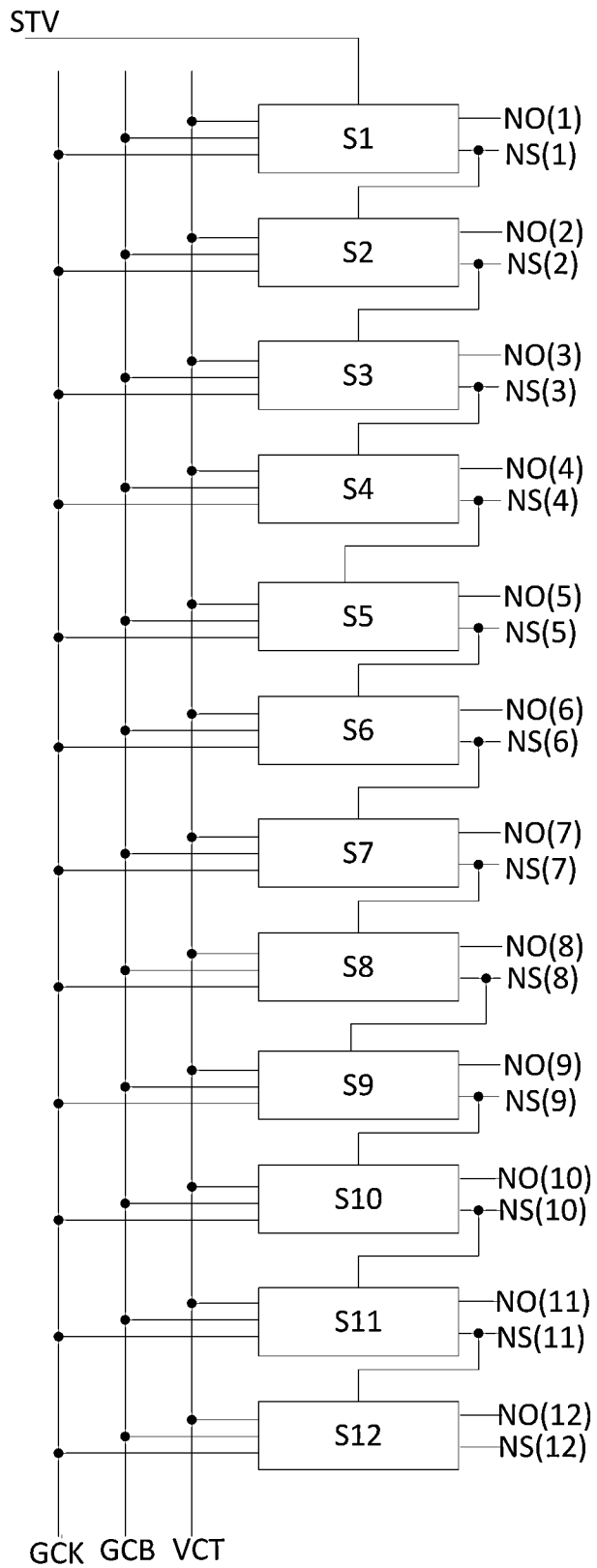
FIG. 29 is a structural diagram of a driving module according to at least one embodiment of the present disclosure.

As shown in FIG. 29, the one labeled S1 is the first stage of driving circuit, the one labeled S2 is the second stage of driving circuit, the one labeled S3 is the third stage of driving circuit, and the one labeled S4 is the fourth stage of driving circuit, the one labeled S5 is the fifth stage of driving circuit, the one labeled S6 is the sixth stage of driving circuit, the one labeled S7 is the seventh stage of driving circuit, the one labeled S8 is the eighth stage of driving circuit, and the one labeled S9 is the ninth stage of driving circuit, the one labeled S10 is the tenth stage of driving circuit, the one labeled S11 is the eleventh stage of driving circuit, and the one labeled S12 is the twelfth stage of driving circuit;

The one labeled NS (1) is the driving signal output terminal of S1, and the one labeled NO (1) is the output driving terminal of S1;

The one labeled NS (2) is the driving signal output terminal of S2, and the one labeled NO (2) is the output driving terminal of S2; S2 is electrically connected to NS (1);

The one labeled NS (3) is the driving signal output terminal of S3, and the one labeled NO (3) is the output driving terminal of S3; S3 is electrically connected to NS (2);

The one labeled NS (4) is the driving signal output terminal of S4, and the one labeled NO (4) is the output driving terminal of S4; S4 is electrically connected to NS (3);

The one labeled NS (5) is the driving signal output terminal of S5, and the one labeled NO (5) is the output driving terminal of S5; S5 is electrically connected to NS (4);

The one labeled NS (6) is the driving signal output terminal of S6, and the one labeled NO (6) is the output driving terminal of S6; S6 is electrically connected to NS (5);

The one labeled NS (7) is the driving signal output terminal of S7, and the one labeled NO (7) is the output driving terminal of S7; S7 is electrically connected to NS (6);

The one labeled NS (8) is the driving signal output terminal of S8, and the one labeled NO (8) is the output driving terminal of S8; S8 is electrically connected to NS (7);

The one labeled NS (9) is the driving signal output terminal of S9, and the one labeled NO (9) is the output driving terminal of S9; S9 is electrically connected to NS (8);

The one labeled NS (10) is the driving signal output terminal of S10, and the one labeled NO (10) is the output driving terminal of S10; S10 is electrically connected to NS (9);

The one labeled NS (11) is the driving signal output terminal of S11, and the one labeled NO (11) is the output driving terminal of S11; S11 is electrically connected to NS (10);

The one labeled NS (12) is the driving signal output terminal of S12, and the one labeled NO (12) is the output driving terminal of S12; S12 is electrically connected to NS (11);

S1, S2, S3, S4, S5, S6, S7, S8, S9, S10, S11 and S12 are all electrically connected to the gating input terminal VCT;

S1, S2, S3, S4, S5, S6, S7, S8, S9, S10, S11 and S12 are all electrically connected to the first clock signal terminal GCK;

S1, S2, S3, S4, S5, S6, S7, S8, S9, S10, S11 and S12 are all electrically connected to the second clock signal terminal GCB.

In FIG. 29, the one labeled STV is the initial voltage terminal, and S1 is electrically connected to STV.

Figure 30:
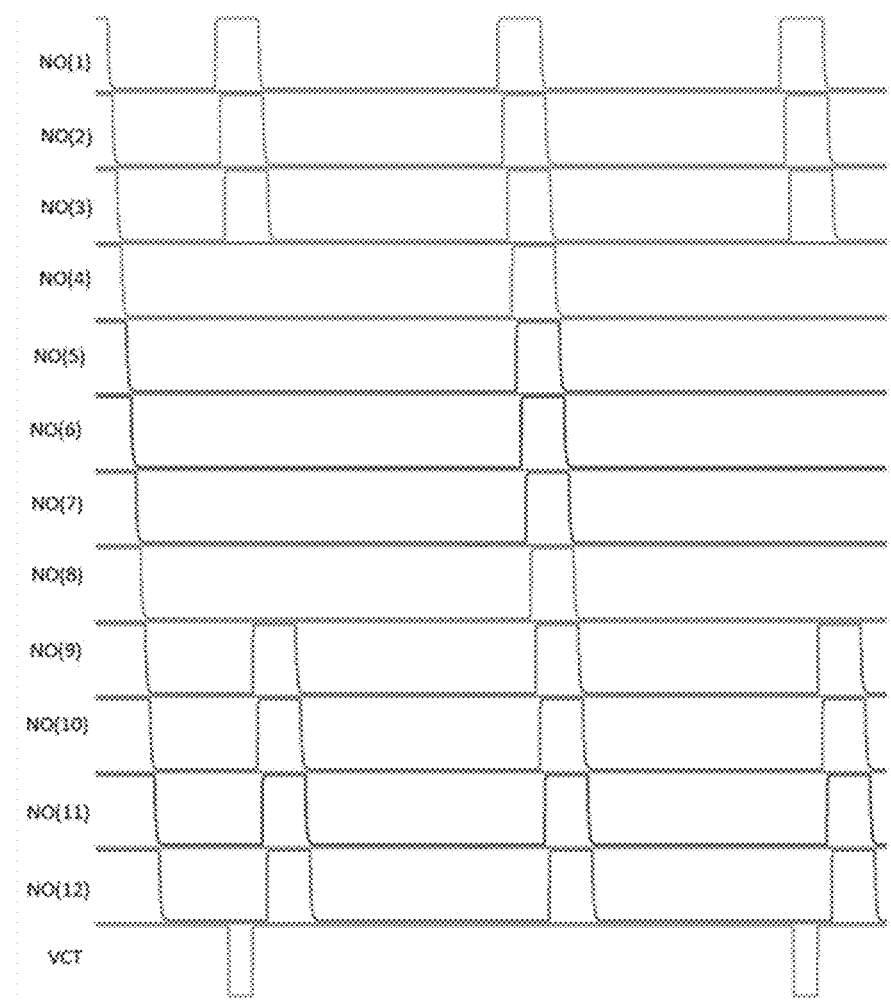
FIG. 30 is a working timing diagram of the driving module shown in FIG. 29.

FIG. 30 is a working timing diagram of the driving module shown in FIG. 29.

When the driving module shown in FIG. 29 of the present disclosure is working, NS(N−1) outputs a high voltage signal and NS(N) outputs a low voltage signal, if VCT outputs a low voltage signal, then when NS (N) outputs a high voltage signal, NO (N) outputs a low voltage signal;

When NS(N−1) outputs a high voltage signal and NS(N) outputs a low voltage signal, if VCT outputs a high voltage signal, then when NS(N) outputs a high voltage signal, NO(N) outputs a high voltage signal.

Figure 31:
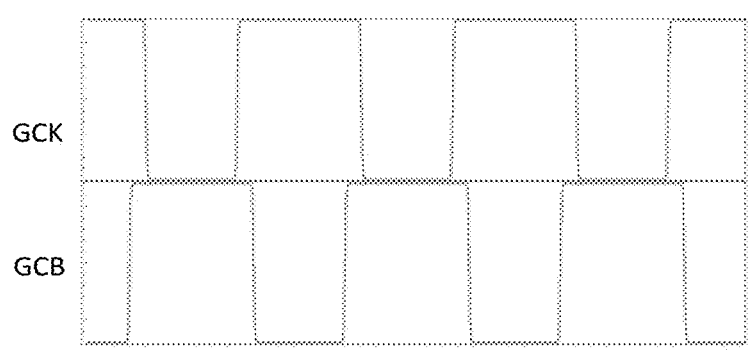
FIG. 31 is a waveform diagram of the first clock signal provided by GCK and the second clock signal provided by GCB.

FIG. 31 is a waveform diagram of the first clock signal provided by GCK and the second clock signal provided by GCB.

The display device described in the embodiment of the present disclosure includes the above-mentioned driving module.

The display device provided by the embodiments of the present disclosure may be any product or component with a display function, such as a mobile phone, a tablet computer, a television, a monitor, a notebook computer, a digital photo frame, a navigator, and the like.

The above descriptions are implementations of the present disclosure. It should be pointed out that those skilled in the art can make some improvements and modifications without departing from the principle of the present disclosure. These improvements and modifications shall also fall within the scope of the present disclosure.

What is claimed is:

1. A driving circuit, comprising a driving signal generation circuit, a gating circuit, an output control circuit and an output circuit; wherein the driving signal generation circuit is configured to generate and output an Nth stage of driving signal through an Nth stage of driving signal output terminal;

the gating circuit is electrically connected to a first node, a gating input terminal and a gating control terminal respectively, and is configured to control to write a gating input signal provided by the gating input terminal into the first node under the control of a gating control signal provided by the gating control terminal;

a first terminal of the output control circuit is electrically connected to the Nth stage of driving signal output terminal, and a second terminal of the output control circuit is electrically connected to the first node, the output control circuit is configured to perform a NAND operation on the Nth stage of driving signal and a potential of the second terminal of the output control circuit to obtain a first output signal;

the output circuit is configured to invert the first output signal to obtain and provide an output driving signal through an output driving terminal;

N is a positive integer.

2. The driving circuit according to claim 1, wherein the driving signal generation circuit includes a first control node control circuit, a second control node control circuit, a first driving output circuit, and a second driving output circuit;

the first control node control circuit is configured to control a potential of a first control node;

the second control node control circuit is configured to control a potential of a second control node;

the first driving output circuit is electrically connected to the first control node, the first voltage terminal and the Nth stage of driving signal output terminal respectively, and is configured to control to connect the Nth stage of driving signal output terminal and the first voltage terminal under the control of the potential of the first control node;

the second driving output circuit is electrically connected to the second control node, the second voltage terminal, and the Nth stage of driving signal output terminal, and is configured to control to connect the Nth stage of driving signal output terminal and the second voltage terminal under the control of the potential of the second control node.

3. The driving circuit according to claim 2, wherein the first control node control circuit includes a seventh node control circuit, an eighth node control circuit, and a first control circuit;

the seventh node control circuit is respectively electrically connected to a first clock signal terminal, a first voltage terminal, a seventh node and a ninth node, and is configured to control to connect the seventh node and the first voltage terminal under the control of a first clock signal provided by the first clock signal terminal, control to connect the seventh node and the first clock signal terminal under the control of a potential of the ninth node;

the eighth node control circuit is electrically connected to a second voltage terminal, the seventh node, and an eighth node, and is configured to control to connect the seventh node and the eighth node under the control of a second voltage signal provided by the second voltage terminal;

the first control circuit is electrically connected to the eighth node, the second node, the second clock signal terminal, the ninth node, the first voltage terminal and the first control node, and is configured to control to connect the second node and the second clock signal terminal under the control of a potential of the eighth node, control the potential of the second node according to the potential of the eighth node, and control to connect the second node and the first control node under the control of the second clock signal provided by the second clock signal terminal, and control to connect the first control node and the first voltage terminal under the control of a potential of the ninth node.

4. The driving circuit according to claim 3, wherein the seventh node control circuit includes an eighteenth transistor and a nineteenth transistor;
   a gate electrode of the eighteenth transistor is electrically connected to the first clock signal terminal, a first electrode of the eighteenth transistor is electrically connected to the second voltage terminal, and a second electrode of the eighteenth transistor is electrically connected to the seventh node;
   a gate electrode of the nineteenth transistor is electrically connected to the ninth node, a first electrode of the nineteenth transistor is electrically connected to the seventh node, and a second electrode of the nineteenth transistor is electrically connected to the first clock signal terminal;
   the eighth node control circuit includes a twentieth transistor;
   a gate electrode of the twentieth transistor is electrically connected to the second voltage terminal, a first electrode of the twentieth transistor is electrically connected to the seventh node, and a second electrode of the twentieth transistor is electrically connected to the eighth node;
   the first control circuit includes a twenty-first transistor, a fourth capacitor, a twenty-second transistor, and a twenty-third transistor;
   a gate electrode of the twenty-first transistor is electrically connected to the eighth node, a first electrode of the twenty-first transistor is electrically connected to the second clock signal terminal, and a second electrode of the twenty-first transistor electrically connected to the second node;
   a first terminal of the fourth capacitor is electrically connected to the eighth node, and a second terminal of the fourth capacitor is electrically connected to the second node;
   a gate electrode of the twenty-second transistor is electrically connected to the second clock signal terminal, a first electrode of the twenty-second transistor is electrically connected to the second node, and a second electrode of the twenty-second transistor is electrically connected to the first control node;
   a gate electrode of the twenty-third transistor is electrically connected to the ninth node, a first electrode of the twenty-third transistor is electrically connected to the first control node, and a second electrode of the twenty-third transistor is electrically connected to the first voltage terminal.

5. The driving circuit according to claim 2, wherein the second control node control circuit includes a ninth node control circuit, a tenth node control circuit, an eleventh node control circuit, and a second control circuit;
   the ninth node control circuit is electrically connected to the first clock signal terminal, the (N−1)th stage of driving signal output terminal, the initial control terminal, the first voltage terminal and the ninth node, is configured to control to connect the (N−1)th stage of driving signal output terminal and the ninth node under the control of the first clock signal provided by the first clock signal terminal, and control to connect the ninth node and the first voltage terminal under the control of the initial control signal provided by the initial control terminal;
   the tenth node control circuit is electrically connected to the first clock signal terminal, the (N−1)th stage of driving signal output terminal and a tenth node, and is configured to control to connect the (N−1)th stage of driving signal output terminal and the tenth node under the control of the first clock signal;
   the eleventh node control circuit is respectively electrically connected to the second voltage terminal, the tenth node, an eleventh node, the seventh node, the first voltage terminal, a twelfth node and the second clock signal terminal, is configured to control to connect the tenth node and the eleventh node under the control of the second voltage signal provided by the second voltage terminal, and control to connect the twelfth node and the first voltage terminal under the control of the potential of the seventh node, and control to connect the twelfth node and the second clock signal terminal under the control of the potential of the eleventh node, and control the potential of the eleventh node according to the potential of the twelfth node;
   the second control circuit is electrically connected to the second control node, the eleventh node, the second voltage terminal and the ninth node, and is configured to control the potential of the second control node under the control of the potential of the eleventh node, and control to connect the ninth node and the second control node under the control of the second voltage signal provided by the second voltage terminal,
   wherein the first driving output circuit includes a sixteenth transistor and a second capacitor;
   a gate electrode of the sixteenth transistor is electrically connected to the first control node, a first electrode of the sixteenth transistor is electrically connected to the first voltage terminal, and a second electrode of the sixteenth transistor is electrically connected to the Nth stage of driving signal output terminal;
   a first terminal of the second capacitor is electrically connected to the first control node, and a second terminal of the second capacitor is electrically connected to the first voltage terminal;
   the second driving output circuit includes a seventeenth transistor and a third capacitor;
   a gate electrode of the seventeenth transistor is electrically connected to the second control node, a first electrode of the seventeenth transistor is electrically connected to the Nth stage of driving signal output terminal, and a second electrode of the seventeenth transistor is electrically connected to the second voltage terminal;
   first terminal of the third capacitor is electrically connected to the Nth stage of driving signal output terminal, and a second terminal of the third capacitor is electrically connected to the second voltage terminal.

6. The driving circuit according to claim 5, wherein the ninth node control circuit includes a twenty-fourth transistor and a twenty-fifth transistor;
   a gate electrode of the twenty-fourth transistor is electrically connected to the first clock signal terminal, a first electrode of the twenty-fourth transistor is electrically connected to the (N−1)th stage of driving signal output terminal, and a second electrode of the twenty-fourth transistor is electrically connected to the ninth node;
   a gate electrode of the twenty-fifth transistor is electrically connected to the initial control terminal, a first electrode of the twenty-fifth transistor is electrically connected to the first voltage terminal, and a second electrode of the twenty-fifth transistor is electrically connected to the ninth node;
   the tenth node control circuit includes a twenty-sixth transistor;
   a gate electrode of the twenty-sixth transistor is electrically connected to the first clock signal terminal, a first electrode of the twenty-sixth transistor is electrically connected to the (N−1)th stage of driving signal output terminal, and a second electrode of the twenty-sixth is electrically connected to a tenth node;

the eleventh node control circuit includes a twenty-seventh transistor, a twenty-eighth transistor, a twenty-ninth transistor and a fifth capacitor;

a gate electrode of the twenty-seventh transistor is electrically connected to the second voltage terminal, a first electrode of the twenty-seventh transistor is electrically connected to the tenth node, and a second electrode of the twenty-seventh transistor is electrically connected to an eleventh node;

a gate electrode of the twenty-eighth transistor is electrically connected to the seventh node, a first electrode of the twenty-eighth transistor is electrically connected to the first voltage terminal, and a second electrode of the twenty-eighth transistor is electrically connected to a twelfth node;

a gate electrode of the twenty-ninth transistor is electrically connected to the eleventh node, a first electrode of the twenty-ninth transistor is electrically connected to the twelfth node, and a second electrode of the twenty-ninth transistor is electrically connected to the second clock signal terminal;

a first terminal of the fifth capacitor is electrically connected to the twelfth node, and a second terminal of the fifth capacitor is electrically connected to the eleventh node;

the second control circuit includes a thirtieth transistor and a thirty-first transistor;

both a gate electrode of the thirtieth transistor and a first electrode of the thirtieth transistor are electrically connected to the eleventh node, and a second electrode of the thirtieth transistor is electrically connected to the second control node;

a gate electrode of the thirty-first transistor is electrically connected to the second voltage terminal, a first electrode of the thirty-first transistor is electrically connected to the ninth node, and a second electrode of the thirty-first transistor is electrically connected to the second control node.

7. The driving circuit according to claim 1, further comprising a second voltage maintenance circuit, wherein the second voltage maintenance circuit includes a first inverter, a second inverter and a maintenance control circuit;

an input terminal of the first inverter is electrically connected to the first node, an output terminal of the first inverter is electrically connected to the third node, and an input terminal of the second inverter is electrically connected to the third node, and an output terminal of the second inverter is electrically connected to a fourth node;

the first inverter is configured to invert the potential of the first node, and output an inverted potential of the first node through the output terminal of the first inverter;

the second inverter is configured to invert a potential of the input terminal of the second inverter, and output an inverted potential through the output terminal of the second inverter;

the maintenance control circuit is electrically connected to the maintenance control terminal, the fourth node and the first node, and is configured to control to connect or disconnect the fourth node and the first node under the control of a maintenance control signal provided by the maintenance control terminal.

8. The driving circuit according to claim 7, wherein the maintenance control terminal includes a first maintenance control terminal and a second maintenance control terminal;

the maintenance control circuit includes a third transistor and a fourth transistor;

a gate electrode of the third transistor is electrically connected to the first maintenance control terminal, a first electrode of the third transistor is electrically connected to the first node, and a second electrode of the third transistor is electrically connected to the fourth node;

a gate electrode of the fourth transistor is electrically connected to the second maintenance control terminal, a first electrode of the fourth transistor is electrically connected to the fourth node, and a second electrode of the fourth transistor is electrically connected to the first node;

the third transistor is a p-type transistor, and the fourth transistor is an n-type transistor;

the first maintenance control terminal is the (N−1)th stage of driving signal terminal, and the second maintenance control terminal is a first clock signal terminal; or, the first maintenance control terminal is a second clock signal terminal, and the second maintenance control terminal is the first clock signal terminal;

or wherein the first inverter includes a fifth transistor and a sixth transistor, and the second inverter includes a seventh transistor and an eighth transistor;

a gate electrode of the fifth transistor is electrically connected to the first node, a first electrode of the fifth transistor is electrically connected to the first voltage terminal, and a second electrode of the fifth transistor is electrically connected to the third node;

a gate electrode of the sixth transistor is electrically connected to the first node, a first electrode of the sixth transistor is electrically connected to the third node, and a second electrode of the sixth transistor is electrically connected to the second voltage terminal;

the fifth transistor is a p-type transistor, and the sixth transistor is an n-type transistor;

a gate electrode of the seventh transistor is electrically connected to the third node, a first electrode of the seventh transistor is electrically connected to the first voltage terminal, and a second electrode of the seventh transistor is electrically connected to the fourth node;

a gate electrode of the eighth transistor is electrically connected to the third node, a first electrode of the eighth transistor is electrically connected to the fourth node, and a second electrode of the eighth transistor is electrically connected to the second voltage terminal;

the seventh transistor is a p-type transistor, and the eighth transistor is an n-type transistor.

9. The driving circuit according to claim 7, wherein the output control circuit includes a tenth transistor, an eleventh transistor, a twelfth transistor and a thirteenth transistor;

a gate electrode of the tenth transistor is electrically connected to the Nth stage of driving signal output terminal, a first electrode of the tenth transistor is electrically connected to the first voltage terminal, and a second electrode of the tenth transistor is electrically connected to the fifth node;

a gate electrode of the eleventh transistor is electrically connected to the first node, a first electrode of the eleventh transistor is electrically connected to the first voltage terminal, and a second electrode of the eleventh transistor is electrically connected to the fifth node;

a gate electrode of the twelfth transistor is electrically connected to the Nth stage of driving signal output terminal, a first electrode of the twelfth transistor is electrically connected to a fifth node, and a second electrode of the twelfth transistor is electrically connected to a sixth node;

a gate electrode of the thirteenth transistor is electrically connected to the first node, a first electrode of the thirteenth transistor is electrically connected to the sixth node, and a second electrode of the thirteenth transistor is electrically connected to the second voltage terminal;

the tenth transistor and the eleventh transistor are p-type transistors, and the twelfth transistor and the thirteenth transistor are n-type transistors.

10. The driving circuit according to claim 1, further comprising an initialization circuit and a first voltage maintenance circuit; wherein the initialization circuit is electrically connected to an initial control terminal, a first voltage terminal and the first node, and is configured to control to connect the first node and the first voltage terminal under the control of an initial control signal provided by the initial control terminal;

a first terminal of the first voltage maintenance circuit is electrically connected to the first node, a second terminal of the first voltage maintenance circuit is electrically connected to a DC voltage terminal or a third node, and the first voltage maintenance circuit is configured to maintain a potential of the first node.

11. The driving circuit according to claim 10, wherein the initialization circuit includes a ninth transistor, and the first voltage maintenance circuit includes a first capacitor;

a gate electrode of the ninth transistor is electrically connected to the initial control terminal, a first electrode of the ninth transistor is electrically connected to the first voltage terminal, and a second electrode of the ninth transistor is electrically connected to the first node;

a first terminal of the first capacitor is electrically connected to the first node, and a second terminal of the first capacitor is electrically connected to the DC voltage terminal or the third node.

12. The driving circuit according to claim 1, further comprising a second voltage maintenance circuit; wherein the first node is electrically connected to the second terminal of the output control circuit through the second voltage maintenance circuit;

the second voltage maintenance circuit includes a first inverter, a second inverter and a maintenance control circuit;

an input terminal of the first inverter is electrically connected to the first node, an output terminal of the first inverter is electrically connected to the third node, and an input terminal of the second inverter is electrically connected to the third node, and an output terminal of the second inverter is electrically connected to the fourth node and the second terminal of the output control circuit;

the first inverter is configured to invert the potential of the first node, and output an inverted potential of the first node through the output terminal of the first inverter, and the second inverter is configured to invert a potential of the input terminal of the second inverter, and output an inverted potential through the output terminal of the second inverter;

the maintenance control circuit is electrically connected to the maintenance control terminal, the fourth node and the first node, and is configured to control to connect or disconnect the fourth node and the first node under the control of the maintenance control signal provided by the maintenance control terminal.

13. The driving circuit according to claim 12, wherein the output control circuit includes a tenth transistor, an eleventh transistor, a twelfth transistor and a thirteenth transistor;

a gate electrode of the tenth transistor is electrically connected to the Nth stage of driving signal output terminal, a first electrode of the tenth transistor is electrically connected to the first voltage terminal, and a second electrode of the tenth transistor is electrically connected to a fifth node;

a gate electrode of the eleventh transistor is electrically connected to the fourth node, a first electrode of the eleventh transistor is electrically connected to the first voltage terminal, and a second electrode of the eleventh transistor is electrically connected to the fifth node;

a gate electrode of the twelfth transistor is electrically connected to the Nth stage of driving signal output terminal, a first electrode of the twelfth transistor is electrically connected to the fifth node, and a second electrode of the twelfth transistor is electrically connected to a sixth node;

a gate electrode of the thirteenth transistor is electrically connected to the fourth node, a first electrode of the thirteenth transistor is electrically connected to the sixth node, and a second electrode of the thirteenth transistor is electrically connected to the second voltage terminal;

the tenth transistor and the eleventh transistor are p-type transistors, and the twelfth transistor and the thirteenth transistor are n-type transistors.

14. A driving module, comprising a plurality of stages of driving circuits according to claim 1; wherein an Nth stage of driving circuit is electrically connected to a driving signal output terminal included in an (N−1)th stage of driving circuit; N is a positive integer.

15. A display device comprising the driving module according to claim 14.

16. The driving circuit according to claim 1, wherein the gating circuit is configured to control to write the gating input signal provided by the gating input terminal into the first node when a potential of the (N−1)th stage of driving signal is a first voltage and a potential of the Nth stage of driving signal is a second voltage.

17. The driving circuit according to claim 1, wherein the gating circuit includes a first transistor; a gate electrode of the first transistor is electrically connected to the gating control terminal, and a first electrode of the first transistor is electrically connected to the first node, a second electrode of the first transistor is electrically connected to the gating input terminal.

18. The driving circuit according to claim 1, wherein the gating control terminal includes a first gating control terminal and a second gating control terminal; the gating circuit includes a first transistor and a second transistor;

a gate electrode of the first transistor is electrically connected to the first gating control terminal, a first electrode of the first transistor is electrically connected to the first node, and a second electrode of the first transistor is electrically connected to a first electrode of the second transistor;

a gate electrode of the second transistor is electrically connected to the second gating control terminal, and a second electrode of the second transistor is electrically connected to the gating input terminal;

the first gating control terminal is an (N−1)th stage of driving signal output terminal, the second gating control terminal is the Nth stage of driving signal output terminal, the first transistor is an n-type transistor, and the second transistor is a p-type transistor; or, the first gating control terminal is the Nth stage of driving signal output terminal, the second gating control terminal is the (N−1)th stage of driving signal output terminal, the first transistor is a p-type transistor, and the second transistor is an n-type transistor; or, the first gating control terminal is an (N−1)th stage of second node, the second gating control terminal is the Nth stage of driving signal output terminal, and the first transistor and the second transistor are p-type transistors; or, the first gating control terminal is the Nth stage of driving signal output terminal, the second gating control terminal is the (N−1)th stage of second node, and both the first transistor and the second transistor are p-type transistors; or, the first gating control terminal is connected to an inversion signal of the (N−1)th stage of driving signal, the second gating control terminal is the Nth stage of driving signal output terminal, the first transistor and the second transistor are both p-type transistors; or, the first gating control terminal is the Nth stage of driving signal output terminal, and the second gating control terminal is connected to the inversion signal of the (N−1)th stage of driving signal; the first transistor and the second transistor are both p-type transistors; or, the first gating control terminal is the (N−1)th stage of driving signal terminal, the second gating control terminal is connected to an inversion signal of the Nth stage of driving signal, and the first transistor and the second transistor are both n-type transistors; or, the first gating control terminal is connected to the inversion signal of the Nth stage of driving signal, the second gating control terminal is the (N−1)th stage of driving signal terminal, and the first transistor and the second transistor are both n-type transistors.

19. The driving circuit according to claim 1, wherein the output circuit includes a fourteenth transistor and a fifteenth transistor;

a gate electrode of the fourteenth transistor is electrically connected to the fifth node, a first electrode of the fourteenth transistor is electrically connected to the first voltage terminal, and a second electrode of the fourteenth transistor is connected to the output driving terminal;

a gate electrode of the fifteenth transistor is electrically connected to the fifth node, a first electrode of the fifteenth transistor is electrically connected to the output driving terminal, and a second electrode of the fifteenth transistor is electrically connected to the second voltage terminal.

20. A driving method applied to the driving circuit according to claim 1, comprising:

generating and outputting, by the driving signal generation circuit, the Nth stage of driving signal through the Nth stage of driving signal output terminal;

controlling, by the gating circuit, to write the gating input signal provided by the gating input terminal into the first node under the control of the gating control signal provided by the gating control terminal;

performing, by the output control circuit, the NAND operation on the Nth stage of driving signal and the potential of the second terminal of the output control circuit to obtain the first output signal;

inverting, by the output circuit, the first output signal to obtain and provide the output driving signal through the output driving terminal;

wherein N is a positive integer.

* * * * *